(12) United States Patent
Kanaoka et al.

(10) Patent No.: US 8,151,162 B2
(45) Date of Patent: Apr. 3, 2012

(54) ENCODING DEVICE, DECODING DEVICE, ENCODING/DECODING DEVICE, AND RECORDING/REPRODUCING DEVICE

(75) Inventors: Toshikazu Kanaoka, Kawasaki (JP); Toshio Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 743 days.

(21) Appl. No.: 12/276,958

(22) Filed: Nov. 24, 2008

(65) Prior Publication Data

US 2009/0199073 A1 Aug. 6, 2009

(30) Foreign Application Priority Data

Jan. 31, 2008 (JP) .................................. 2008-21282

(51) Int. Cl.
*H03M 13/00* (2006.01)

(52) U.S. Cl. ........................ 714/755; 714/769

(58) Field of Classification Search .................. 714/755, 714/769

See application file for complete search history.

(56) References Cited

U.S. PATENT DOCUMENTS

| | | | |
|---|---|---|---|
| 6,088,825 A * | 7/2000 | Ikushima et al. | 714/769 |
| 7,434,136 B2 | 10/2008 | Ichihara et al. | |
| 7,644,337 B2 | 1/2010 | Ito et al. | |
| 2004/0187066 A1 | 9/2004 | Ichihara et al. | |
| 2005/0066261 A1 | 3/2005 | Morita et al. | |
| 2005/0089095 A1 * | 4/2005 | Choi et al. | 375/240.12 |
| 2007/0143657 A1 | 6/2007 | Kanaoka et al. | |
| 2007/0266300 A1 | 11/2007 | Ito et al. | |
| 2008/0270872 A1 * | 10/2008 | Shin et al. | 714/781 |
| 2009/0003459 A1 * | 1/2009 | Limberg | 375/240.26 |

FOREIGN PATENT DOCUMENTS

| | | |
|---|---|---|
| JP | A 11-330985 | 11/1999 |
| JP | 2006-60296 | 3/2006 |

OTHER PUBLICATIONS

Toshio Ito, "Encoding Device, Decoding Device, Encoding/Decoding Device and Recording/Reproducing Device," Pending U.S. Appl. No. 11/977,266, filed Oct. 24, 2007.
Toshio Ito, "Maximum Likelihood Detector, Error Correction Circuit and Medium Storage Device," Pending U.S. Appl. No. 11/982,126, filed Nov. 1, 2007.
Toshio Ito, et al.; "Error Correcting Codes for 4K-Byte Sectors," Digest of the 18th Magnetic Recording Conference—TMRC—2007; Minneapolis, MN; May 21-23, 2007; pp. 74-75.

* cited by examiner

*Primary Examiner* — M. Mujtaba K Chaudry
(74) *Attorney, Agent, or Firm* — Greer, Burns & Crain, Ltd.

(57) ABSTRACT

An error correction device error corrects without increasing in circuit scale. An encoder, includes: a first ECC encoder which interleaves a data string into n (n≧2) blocks of data strings at every m (m≧2) bits, and adds the error correction code parity; a parity encoder which creates a parity bit at every plurality of bits of the error correction code word, and adds the parity bit to said error correction code word; and a second ECC encoder, which generates a second error correction encoding, which is a linear encoding using iterative decoding. Concatenated type encoded data, where a parity bit is added to every plurality of bits, is created, so an increase of circuit scale can be prevented even if a data string is interleaved into a plurality of blocks and error correction code parity is generated.

20 Claims, 15 Drawing Sheets

ENCODING DEVICE, DECODING DEVICE, ENCODING/DECODING DEVICE, AND RECORDING/REPRODUCING DEVICE

CROSS-REFERENCE TO RELATED APPLICATIONS

This application is based upon and claims the benefit of priority of the prior Japanese Patent Application No. 2008-21282, filed on Jan. 31, 2008, the entire contents of which are incorporated herein by reference.

RELATED INVENTIONS

The present invention is related to pending U.S. patent application titled "ENCODING DEVICE, DECODING DEVICE, ENCODING/DECODING DEVICE AND RECORDING/REPRODUCING DEVICE" (Ser. No. 11/977,266), and pending U.S. patent application titled "MAXIMUM LIKELIHOOD DETECTOR, ERROR CORRECTION CIRCUIT AND MEDIUM STORAGE DEVICE" (Ser. No. 11/982,126). These are commonly assigned to Fujitsu Limited.

FIELD

The present invention relates to an encoding device, decoding device, encoding/decoding device, and recording/reproducing device for data, including error correction codes used for a recording/reproducing device and communication device, and more particularly to an encoding device, decoding device, encoding/decoding device and recording/reproducing device for error correction of a data block to which an ECC (Error Correction Code) is attached.

BACKGROUND

In the field of recording/reproducing devices, such as a magnetic disk device, and communication systems, error correction technology using error correction codes (ECC) is widely used in order to correct data error generated during recording/reproducing steps and in a transmission line.

For ECC codes, Reed Solomon (RS) codes are used (e.g. Japanese Patent Application Laid-Open No. H11-330985). In RS codes, recording data is RS-encoded in advance, bit strings reproduced after the recording/reproducing step are RS-decoded, and an error, which included the bit strings, is detected and corrected. In other words, RS codes are good in correction capability for symbol units, and are particularly excellent in detection and correction capability for burst errors.

An iterative decoding format is used as the error correction code technology. The error detection and correction capability can be improved by combining the iterative decoding and ECC. Recently, low density parity check (LDPC) codes, which is one type of iterative decoding, have seen practical use.

The LDPC codes can correct errors generated in the recording/reproducing steps by performing LDPC encoding on the recording data in advance, and performing the iterative decoding using a reliability propagation on the signals reproduced via the recording/reproducing step (e.g. Japanese Patent Application Laid-Open No. 2007-166425).

Characteristic of LDPC encoding are the linear codes that can decrease the number of "1s" (check target bit) in parity check matrix H, while increasing the code block length (that is, low density), which can be arranged at random. During LDPC decoding, an error is corrected by performing decoding using reliability propagation, which propagates the likelihood (reliability which indicates the probability of data string "0" and "1") and decodes, and iterative decoding (decoding which iterates between a partial response channel and a reliability propagation decoder).

The LDPC encoding and decoding will now be described. Since the LDPC codes are linear codes, a parity check matrix H is generated so that the following check conditions are satisfied.

$$wH^T = 0 \qquad (1)$$

In Expression (1), w is a code word encoded by LDPC, H is a parity check matrix, and T is a transpose of the matrix.

When the LDPC decoding is performed, the conditions to stop the iterative decoding are following two: one is that the predetermined number of times decoding was performed, and another is that the check conditions of Expression (1) that were satisfied, that is errors do not exist, and in this case, iterative decoding stops, and output is from the decoder.

Generally a log-likelihood ratio (LLR), which is a logarithmic ratio, and which is a ratio of probability that can be "0" and probability that can be "1", is used in determining likelihood. If the original binary data is "1" positive likelihood is provided, and if "0", negative likelihood is provided. Therefore in order to binarize the decoded data string in the iterative decoding output, binary determination can be performed using a threshold decision unit which uses "0" as the threshold.

An encoding device and a decoding device, which perform ECC correction in symbol units by combining RS codes and LDPC codes, which detect and correct an error in bit units using iterative decoding in the pre-stage of ECC, have been proposed (e.g. Japanese Patent Application Laid-Open No. 2005-093038).

Also in ECC correction, a method for improving error correction capability in a plurality of interleave systems, by combining RS codes and parity codes to detect an error, have been proposed (Toshio Itoh, Toshihiko Morita, "Error Correction Codes for 4K byte sectors", IEEE "The Magnetic Recording Conference (TMRC 2007)", 2007).

FIG. 15 is a diagram depicting an error correction method combining conventional RS codes and parity codes. For example, it is assumed that an encoding target is a data string formed of many blocks, of which one block is 80 bits. First each block (80 bits) is interleaved into bit spaces of 20 bits, so as to generate four blocks: 1001, 1002, 1003 and 1004. RS parities 1011, 1012, 1013 and 1014 are added to these four blocks, 1001, 1002, 1003 and 1004, by an ECC encoder respectively.

Also 2 bits of parity 1110 to 111$n$ are calculated by a parity encoder and added to 20 bits×4 (4 blocks)=80 bits in a vertical direction. Therefore the codes generated here are configured by concatenated codes, where the horizontal direction is error correction codes based on RS codes, and the vertical direction is multi-parity (2 bit parity) error detection codes.

In this way, the blocks, divided into 4, are created by a 20-bit interleave, error correction and detection codes are created as concatenated codes, where error correction codes based on RS codes are applied in the horizontal direction of the 4 division blocks, and error detection codes based on multi-parity are applied in the vertical direction thereof.

In terms of sector data strings, an error detection code based on multi-parity is disposed at every 80 bits in a horizontal direction, so that an error can be detected in 80 bit (symbol) units, and the RS code is disposed in four 20-bit interleaves (¼ of 80 bits), so that an error can be corrected in four interleave units. Thereby, when ECC decoding fails, the correction position can be specified locally, thereby contributes to improving gain.

However, in the case of the conventional method of combining LDPC codes used for iterative decoding and RS codes used for ECC in a subsequent stage, correction capability with iterative decoding improves, but little improvement of correction capability with ECC can be expected.

On the other hand, in the case of the proposal where the conventional error correction method (ECC) concatenating RS codes and parity codes, which is based on the assumption that maximum likelihood decoding is used, error correction capability for decoding is not high.

SUMMARY

With the foregoing in view, it is an object of the present invention to provide an encoder, a decoder, encoding/decoding device, and a recording/reproducing device which improve error correction performance based on the combination of decoding and ECC.

It is another object of the present invention to provide an encoder, decoder, encoding/decoding device and recording/reproducing device for preventing deterioration of error correction performance, even if ECC encoding is performed with a multiple interleave configuration by combining linear encoding and ECC.

It is still another object of the present invention to provide an encoder, decoder, encoding/decoding device and recording/reproducing device for improving error correction capability in ECC encoding with a multiple interleave configuration even if LDPC and ECC are combined, and enabling error detection even if local errors concentrate in LDPC.

To achieve the above-described objects, an encoder, includes: an ECC encoder which interleaves a data string into n (n≧2) blocks of data strings at every m (m≧2) bits, generates a first error correction code parity from the data string of each of the interleaved blocks, and adds the first error correction code parity of each block to the data string to create an error correction code word; a parity encoder which creates a parity bit at every plurality of bits of the error correction code word, and adds the parity bit to the error correction code word; and a second ECC encoder which divides a second error correction code word in which a parity generated by the parity encoder is added to the error correction code word, into L (L≧2) number of blocks of data strings at every K (K≧2) bits, generates a second error correction code parity, which is a linear code, in the block units, from the data string of each block, and adds the second error correction code parity of each block to the second error correction code word to create a third error correction code word.

Further, a decoder for decoding the encoded data encoded into the third error correction code word according to the present invention, includes: an iterative decoder which iteratively decodes the received encoded data string using the second ECC code parity, decodes the encoded data string into a bit string, and outputs likelihood of each bit; and an ECC decoding circuit which iteratively performs error correction decoding based on the first error correction code of the encoded data string of the iterative decoder, and the encoded bit string correction decoding based on the likelihood according to error detection based on the parity bit.

Furthermore, an encoding/decoding device, includes: an ECC encoder which interleaves a data string into n (n≧2) blocks of data strings at every m (m≧2) bits, generates a first error correction code parity from the data string of each of the interleaved blocks, and adds the first error correction code parity of each block to the data string to create an error correction code word; a parity encoder which creates a parity bit at every plurality of bits of the error correction code word, and adds the parity bit to the error correction code word; a second ECC encoder which divides a second error correction code word in which a parity generated by the parity encoder is added to the error correction code word, into L (L≧2) number of blocks of data strings at every K (K≧2) bits, generates a second error correction code parity, which is a linear code, in the block units, from the data string of each block, and adds the second error correction code parity of each block to the second error correction code word to create a third error correction code word; an iterative decoder which iteratively decodes the received encoded data string using the second ECC code parity, decodes the encoded data string into a bit string, and outputs likelihood of each bit; and an ECC decoding circuit which iteratively performs error correction decoding based on the first error correction code of the encoded data string of the iterative decoder, and the encoded bit string correction decoding based on the likelihood according to error detection based on the parity bit.

Additionally, a recording/reproducing device, includes: a head which writes and reads data to/from a storage medium; an ECC encoder which interleaves a data string to be written to the storage medium into n (n≧2) blocks of data strings at every m (m≧2) bits, generates a first error correction code parity from the data string of each of the interleaved blocks, and adds the first error correction code parity of each block to the data string to create an error correction code word; a parity encoder which creates a parity bit at every plurality of bits of the error correction code word, and adds the parity bit to the error correction code word; a second ECC encoder which divides a second error correction code word in which a parity generated by the parity encoder is added to the error correction code word, into L (L≧2) number of blocks of data strings at every K (K≧2) bits, generates a second error correction code parity, which is a linear code, in the block units, from the data string of each block, and adds the second error correction code parity of each block to the second error correction code word to create a third error correction code word, and outputs the third error correction code word to the head; an iterative decoder which iteratively decodes the encoded data string read by the head, using the second ECC code parity, decodes the encoded data string into a bit string, and outputs likelihood of each bit; and an ECC decoding circuit which iteratively performs error correction decoding based on the first error correction code of the encoded data string of the iterative decoder, and the encoded bit string correction decoding based on the likelihood according to error detection based on the parity bit.

Further, it is preferable to provide an encoder according to the present invention, wherein the second ECC encoder creates a third error correction code word, which satisfies a requirement of a low density parity check (LDPC) code, in which a number of "1s" in a parity check matrix is low (low density) and the code is a linear code, and generates a parity using a generation matrix corresponding to the parity check matrix.

Furthermore, it is preferable to provide an encoder according to the present invention, wherein the parity encoder divides said error correction code word into L (L≧2) number of blocks, extracts q (q≧2) number of data strings in p (p≧1) bit units from each of said divided blocks, and generates parities for p×q number of data strings.

In addition, it is preferable to provide an encoder according to the present invention, wherein the parity encoder adds the parities generated for the p×q number of data strings to blocks other than the blocks that include the data strings used for the generation of the parities.

Further, it is preferable to provide an encoder according to the present invention, wherein the ECC encoder includes: an interleave unit which interleaves the data string into n (n≧2) blocks of data strings at every m (m≧2) bits; an ECC encoding unit which generates an error correction code parity from the data string of each of the interleaved blocks; and a de-interleave unit which de-interleaves the data string of each of the blocks at every the m bits, restores the de-interleaved data string back to the data string, and adds a parity of the error correction code to the restored data string.

Furthermore, it is preferable to provide an encoder according to the present invention, in which the ECC encoder generates a Reed Solomon code as the error correction code.

Additionally, it is preferable to provide a decoder according to the present invention, in which the iterative decoder performs the iterative decoding using the parity of the second error correction code word, from the third error correction code word which satisfies a requirement of a low density parity check (LDPC) code, in which a number of "1s" in the parity check matrix is low (low density) and the code is a linear code, performs hard decision on the encoded data string to be the second error correction code word, and outputs the likelihood of each bit.

Further, it is preferable to provide a decoder according to the present invention, in which the iterative decoder stops the iterative decoding, and sets the likelihood of each bit in the block of the second error correction code word to a maximum likelihood value, when the block of the second error correction code word satisfies the parity check condition and an error is not detected in the error detection of the second error correction code word based on the parity bit string.

Furthermore, it is preferable to provide a decoder according to the present invention, in which the ECC decoding circuit includes: an ECC decoder which performs error correction based on the first error correction code of the code bit string from the iterative decoder; and a parity/likelihood correction unit which performs error detection based on the parity bit when the decoding by the ECC decoder fails, and corrects the code bit string to be input to the ECC decoder based on the likelihood using the result of the error detection.

It is preferable to provide a decoder according to the present invention, further includes: a separation unit which separates the parity bit from the code bit string from the iterative decoder, and outputs the parity bit to the parity/likelihood correction unit; an interleave unit which interleaves the code bit string from which the parity bit has been separated into n (n≧2) blocks of data strings at every the m (m≧2) bits; and a data storage unit which stores the data string of each of the interleaved blocks, wherein the ECC decoder performs error correction on the data string of each block of the data storage unit based on the error correction code, and the parity/likelihood correction unit corrects the data string of the data storage unit.

Additionally, it is preferable to provide a decoder according to the present invention, wherein when the decoding fails, the parity/likelihood correction unit extracts q (q≧2) number of data strings in p (p≧1) bit units from the L number of blocks including the failed block, regenerates parities for p×q number of data strings, and compares the parities with the added parity bits to detect errors.

Further, it is preferable to provide a decoder according to the present invention, wherein the parity/likelihood correction unit extracts parities added to blocks other than said blocks that include the data stings used for the generation of said parities, and compares the parities with the regenerated parities.

Furthermore, it is preferable to provide a decoder according to the present invention, wherein the error correction code of the encoded data string is a Reed Solomon code.

A data string is interleaved into a plurality of blocks at every m (m≧2) bits, error correction code parity is added, and concatenated type encoded data, where a parity bit is added to every plurality of bits, is created, so an increase of circuit scale can be prevented. Also a second error correction encoding, which is a linear encoding using iterative decoding, is used in tandem, so an error of ECC input can be corrected by iterative decoding, and deterioration of correction performance can be prevented. As a result, error correction performance can be improved while preventing an increase in circuit scale of a long sector type recording/reproducing device which is used for Windows'® Vista®.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE PREFERRED EMBODIMENTS

Embodiments of the present invention will now be described in the sequence of recording/reproducing system, encoder, decoder, ECC decoder, encoding and decoding operation, and other embodiments, but the present invention is not limited to these embodiments.

(Recording/Reproducing System)

Figure 1:
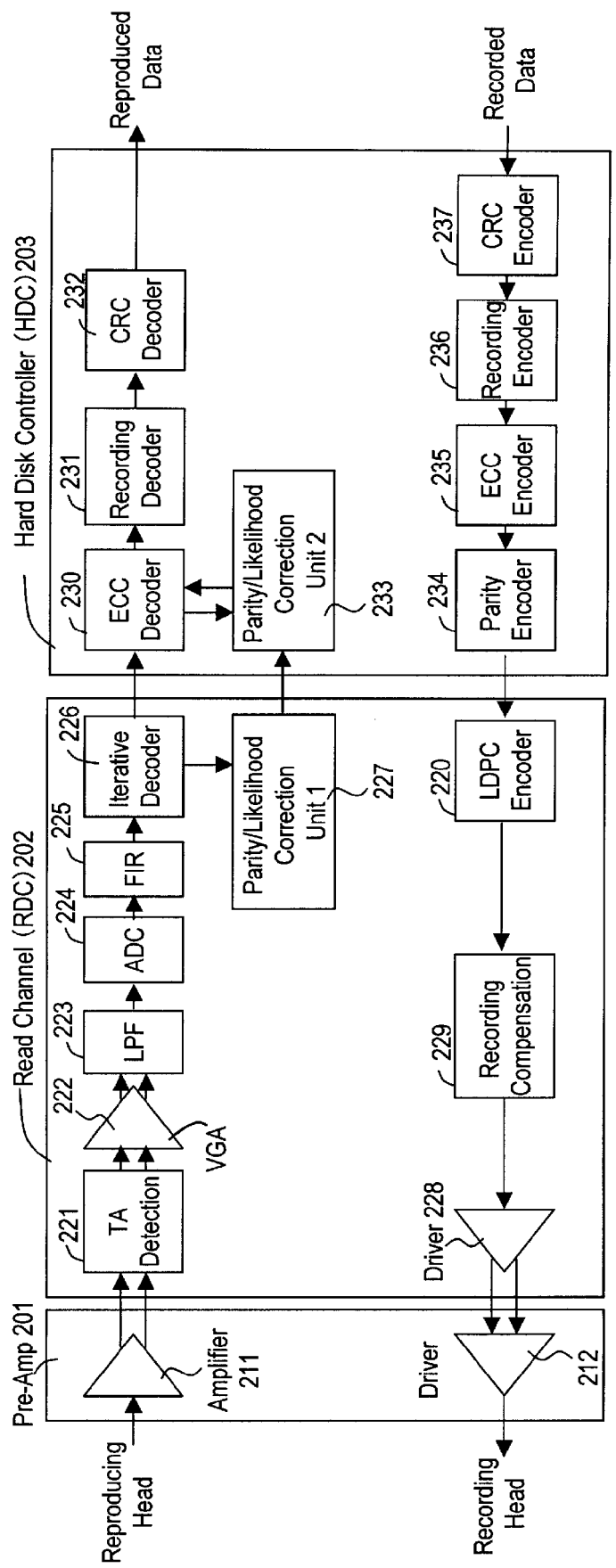
FIG. 1 is a block diagram depicting a recording/reproducing system of a medium storage device according to an embodiment of the present invention.

FIG. 1 is a block diagram depicting a recording/reproducing system of a magnetic disk device according to an embodiment of the present invention. As FIG. 1 shows, the recording/reproducing system of the magnetic disk device has a hard disk controller (HDC) 203, a read channel (RDC) 202 and a pre-amp (or head IC) 201.

First recording (encoding) will be described. A CRC encoder 237 in the HDC 203 adds a CRC code (Cyclic Redundancy Code) to record data. Then a recording encoder 236 converts this data into a data string such that the constraint conditions such as MTR (Maximum Transition Run) code and RLL (Run Length Limited) code are satisfied. Then an ECC encoder 235 performs interleave and adds an RS parity string, as mentioned later in FIG. 2 to FIG. 4.

Then a parity encoder 234 calculates 2-bit parity to perform error detection which is different from ECC, as described later in FIG. 2 and FIG. 5, and adds all the calculated 2-bit parities to the ECC-encoded data string.

An ECC-encoded data string, to which the parities are added, is input to the RDC 202. An LDPC encoder 220 in the RDC 202 calculates an LDPC parity to perform another detection, which is different from the ECC codes and parity codes, for each LDPC block, as described later in FIG. 6, and adds each LDPC parity to the ECC-encoded data string, which was also parity-encoded, for each LDPC block.

A recording compensator 229 performs compensation processing to slightly increase the inversion interval at a location where magnetic inversion occurs next to each other. Then a driver 228 in the RDC 202 outputs the data string, after the recording compensation was performed, to the pre-amp 201. In the pre-amp 201, a driver 212 generates write current for a recording head (write head), which is not illustrated, to drive the recording head, and records the data on a magnetic disk, which is not illustrated.

Regeneration will now be described. In the case of regeneration, an amplifier 211 of the pre-amp 201 amplifies analog voltage from a reproducing head (read head), then outputs the amplified analog voltage to the RDC 202. A thermal asperity detection processing unit 221 of the RDC 202 performs thermal asperity processing, then a variable gain amplifier (VGA) 222 adjusts amplitude.

Then a low pass filter (LPF) 223 cuts off high frequencies of a read signal of which amplitude has been adjusted, and an A/D converter (ADC) 224 converts the analog output thereof into digital signals. After this, an FIR (Finite Impulse Response) filter 225 performs PR (Partial Response) waveform equalization, and then outputs the signal to an iterative decoder 226.

The iterative decoder 226 is comprised of a soft input soft output detector and an LDPC decoder, and performs iterative decoding using likelihood, as described in FIG. 9 and later. The soft input soft output detector uses, for example, the Max-log-MAP (Maximum A Posteriori) algorithm, SOVA (Soft-Output Viterbi Algorithm), or noise predictive SOVA (NPSOVA), for example. The LDPC decoder uses the Sum-Product algorithm or the Min-Sum algorithm, for example.

A first parity/likelihood correction unit 227 determines the position information of an error candidate using the likelihood determined by the decoder 226, and creates a table of likelihood and position information. A decoding string, which has been subjected to a hard decision bit string of "0" or "1", is sent from the iterative decoder 226 to the HDC 203. An ECC decoder 230 performs error correction in a four interleave configuration.

If decoding succeeds, a recording decoder 231 performs decoding, which is the reverse of encoding of the recording encoder 236, and a CRC decoder 232 performs CRC decoding, and outputs the resulting data as reproduced data.

If decoding fails in the ECC decoder 230, the data is input to a second parity/likelihood correction unit 233. The second parity/likelihood correction unit 233 corrects the block for which ECC correction failed, using the likelihood and position information table of the first parity/likelihood correction unit 227.

The data corrected by the second parity/likelihood correction unit 233 is input to the ECC decoder 230 where the error is corrected based on ECC. If decoding succeeds in the ECC decoder 230, the data is output as reproduced data via the recording decoder 231 and CRC decoder 232, as mentioned above. If ECC decoding fails, on the other hand, the data is input to the second parity/likelihood correction unit 233 again, where the block is corrected.

As described above, if error correction based on ECC fails, processing in the second parity/likelihood correction unit 233 and ECC decoder 230 is repeated using the likelihood information, whereby correction capability can be improved.

Figure 12:
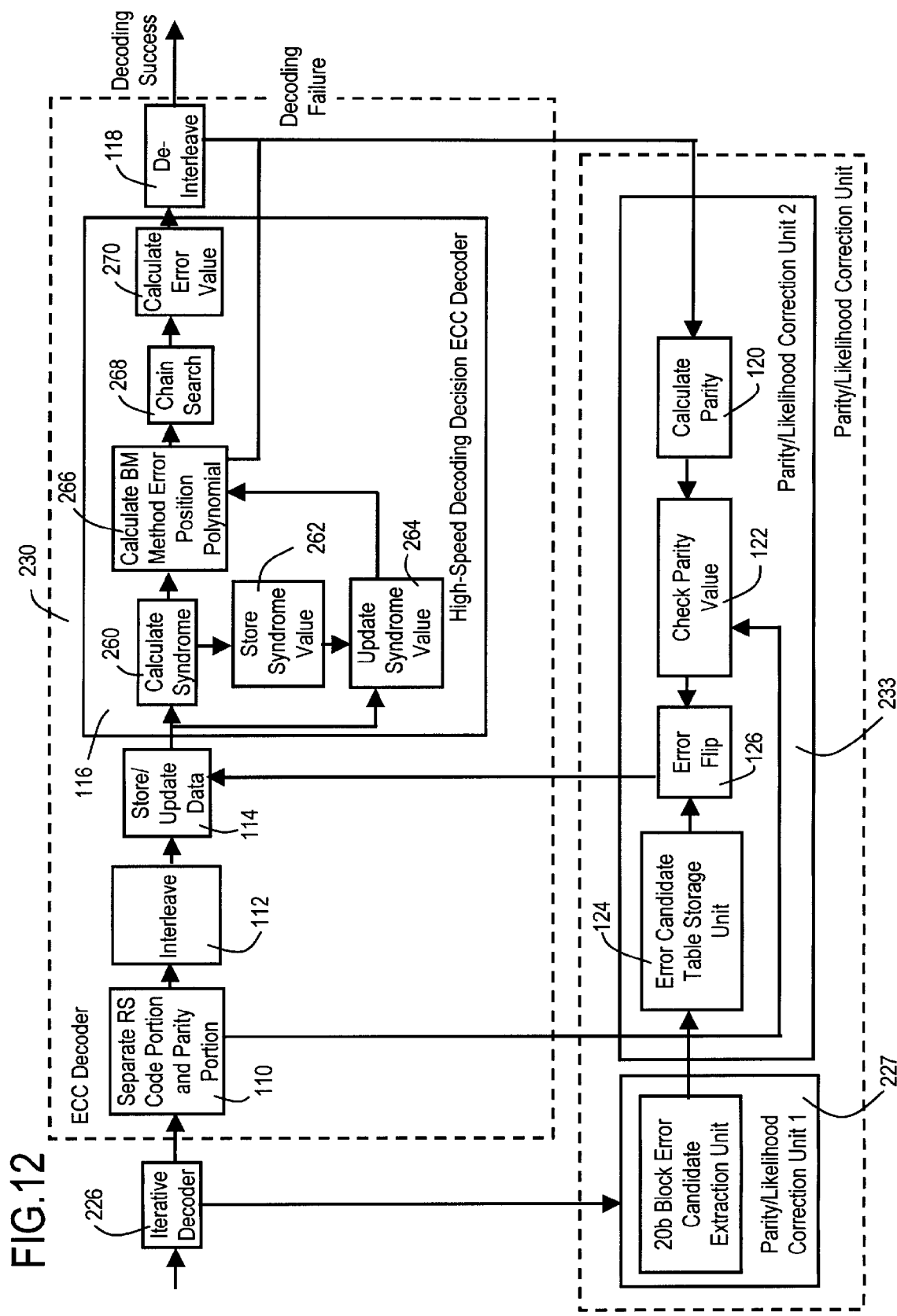
FIG. 12 is a block diagram depicting the ECC decoding unit in FIG. 2.

In this case, a high-speed decision ECC circuit, which is described later in FIG. 12, is used since error correction in the ECC decoder 230 may be repeated several times. This high-speed decision ECC circuit can reduce calculation volume.

In the present invention, the first parity/likelihood correction unit 227 receives the position of each bit of a decoding string and the likelihood thereof from the iterative decoder 226, extracts the bit positions of which likelihood is low (error possibility is high) as error candidates in a unit of a data string to which a parity was added, and creates a table.

Extracting the bit positions of which error possibility is high as error candidates provides the ECC decoder 230 with error candidates with which effective correction can be performed. Since only the bit positions of which error possibility is high are extracted as error candidates, the number of times for the ECC decoder 230 to sort the bit positions in the sequence of likelihood, so as to extract an error candidate in the sequence of lower likelihood, can be decreased, which is effective to reduce calculation volume.

(Encoder)

Figure 3:
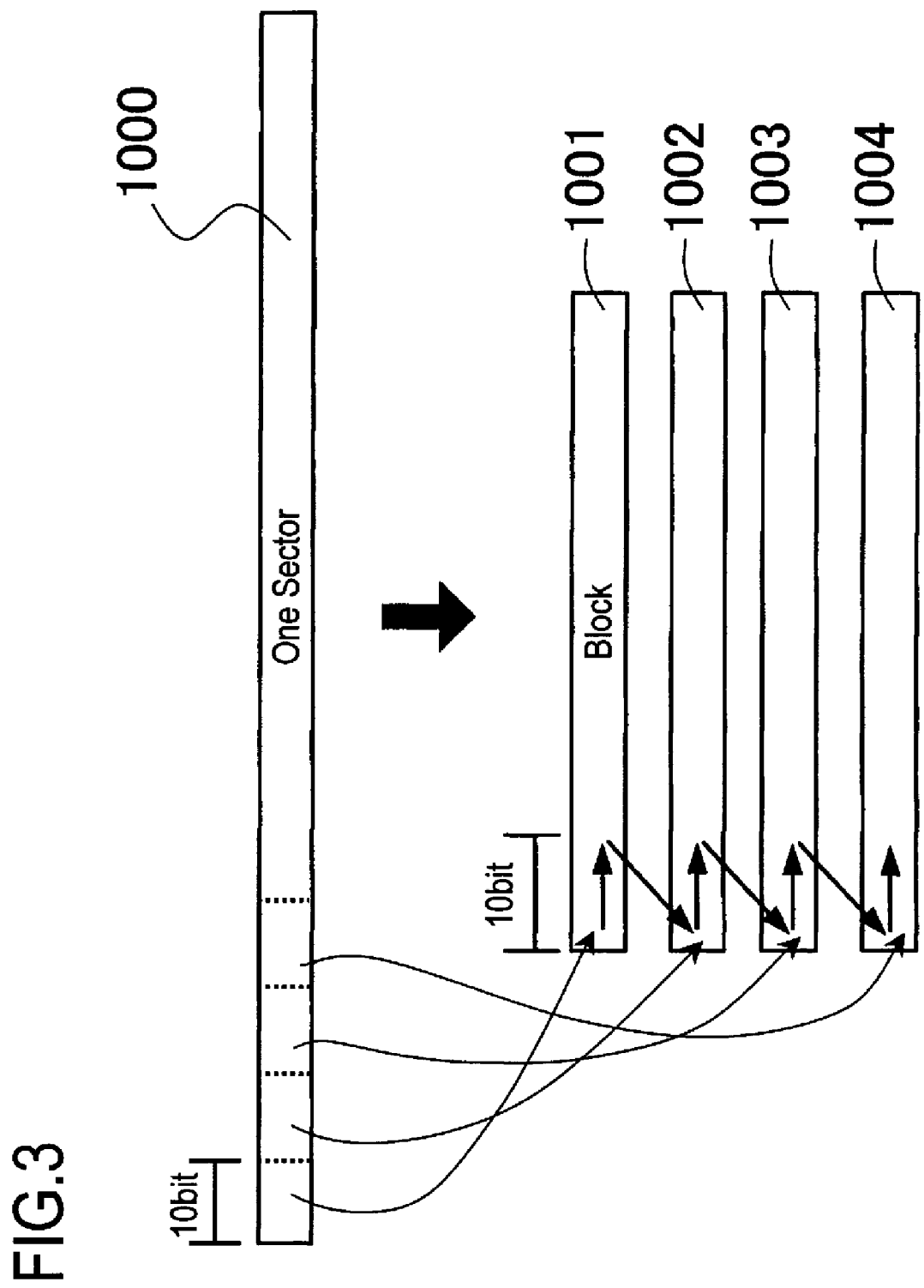
FIG. 3 is a diagram depicting the operation of the interleave unit in FIG. 2.
Figure 4:
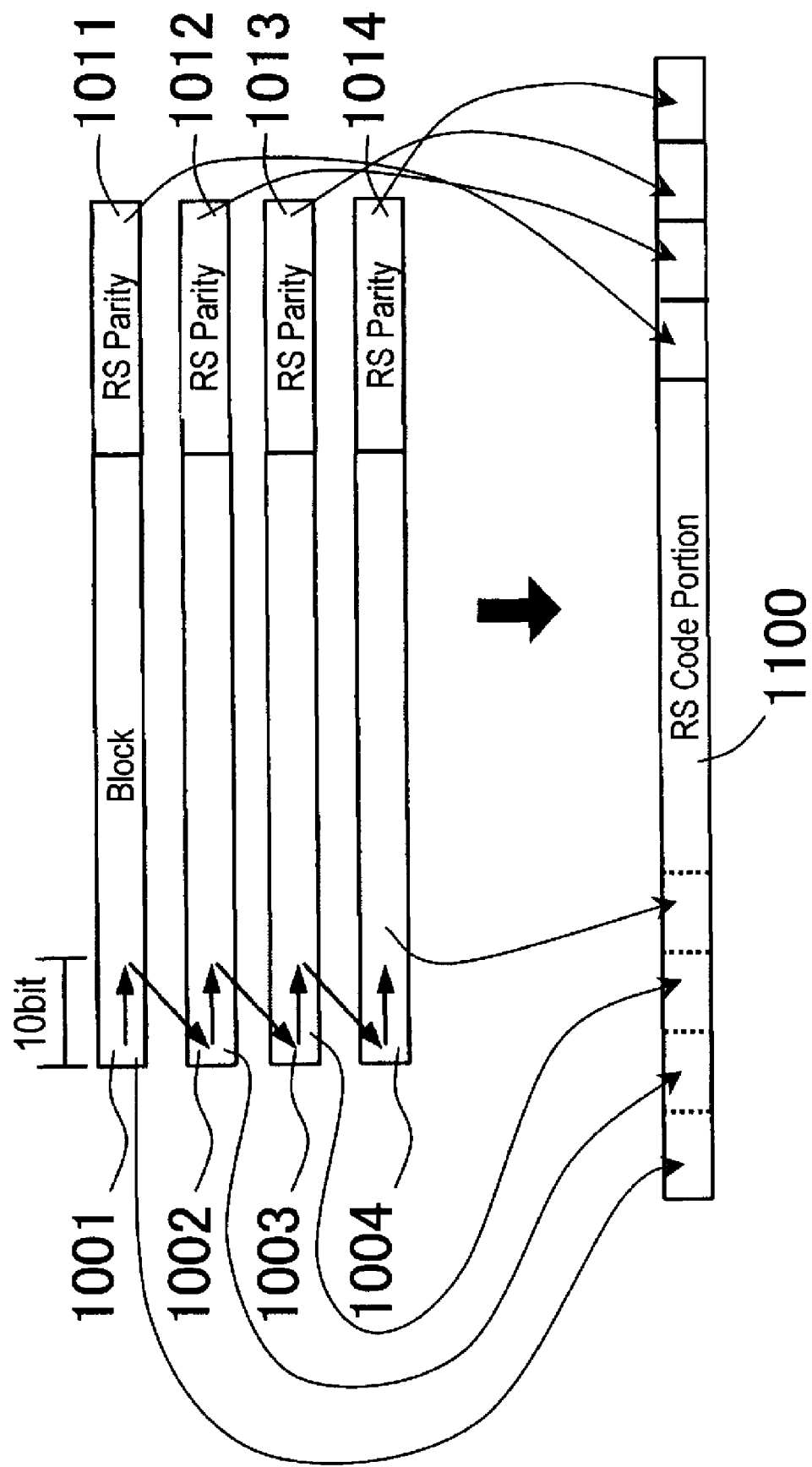
FIG. 4 is a diagram depicting the operation of the ECC encoder in FIG. 2.
Figure 6:
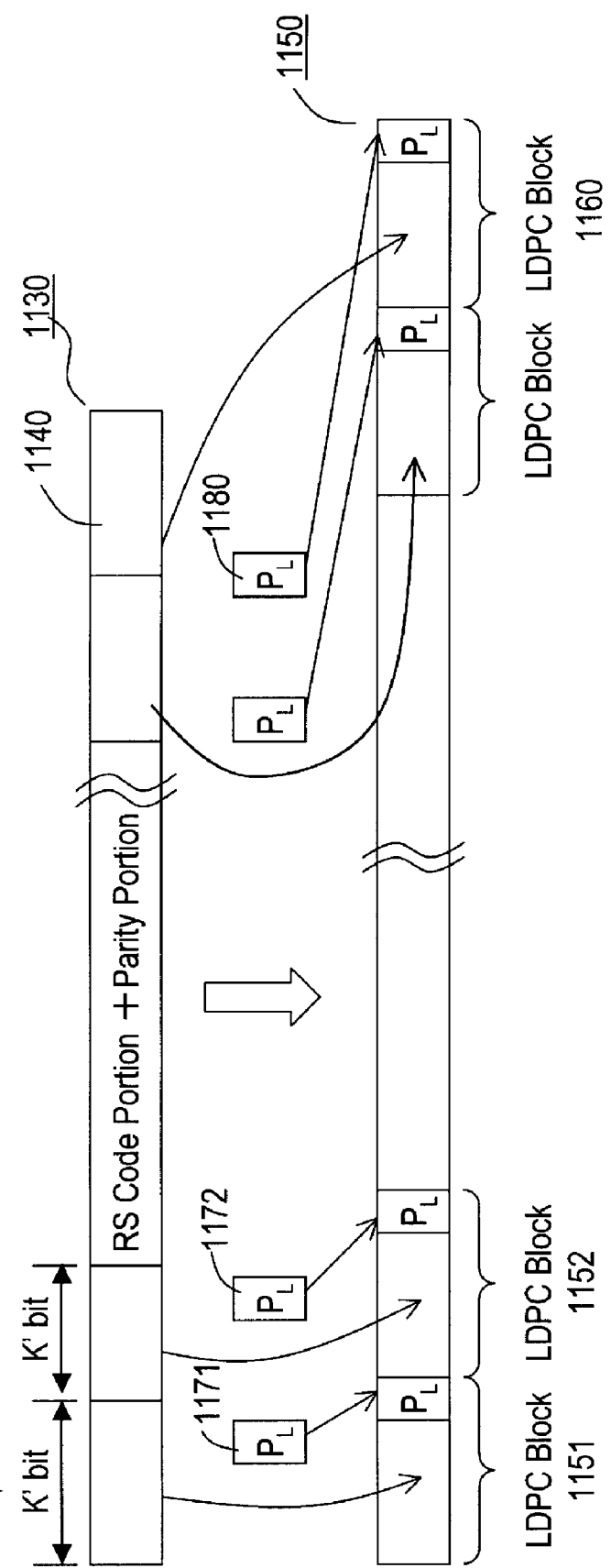
FIG. 6 is a diagram depicting the operation of the LDPC encoder in FIG. 2.
Figure 7:
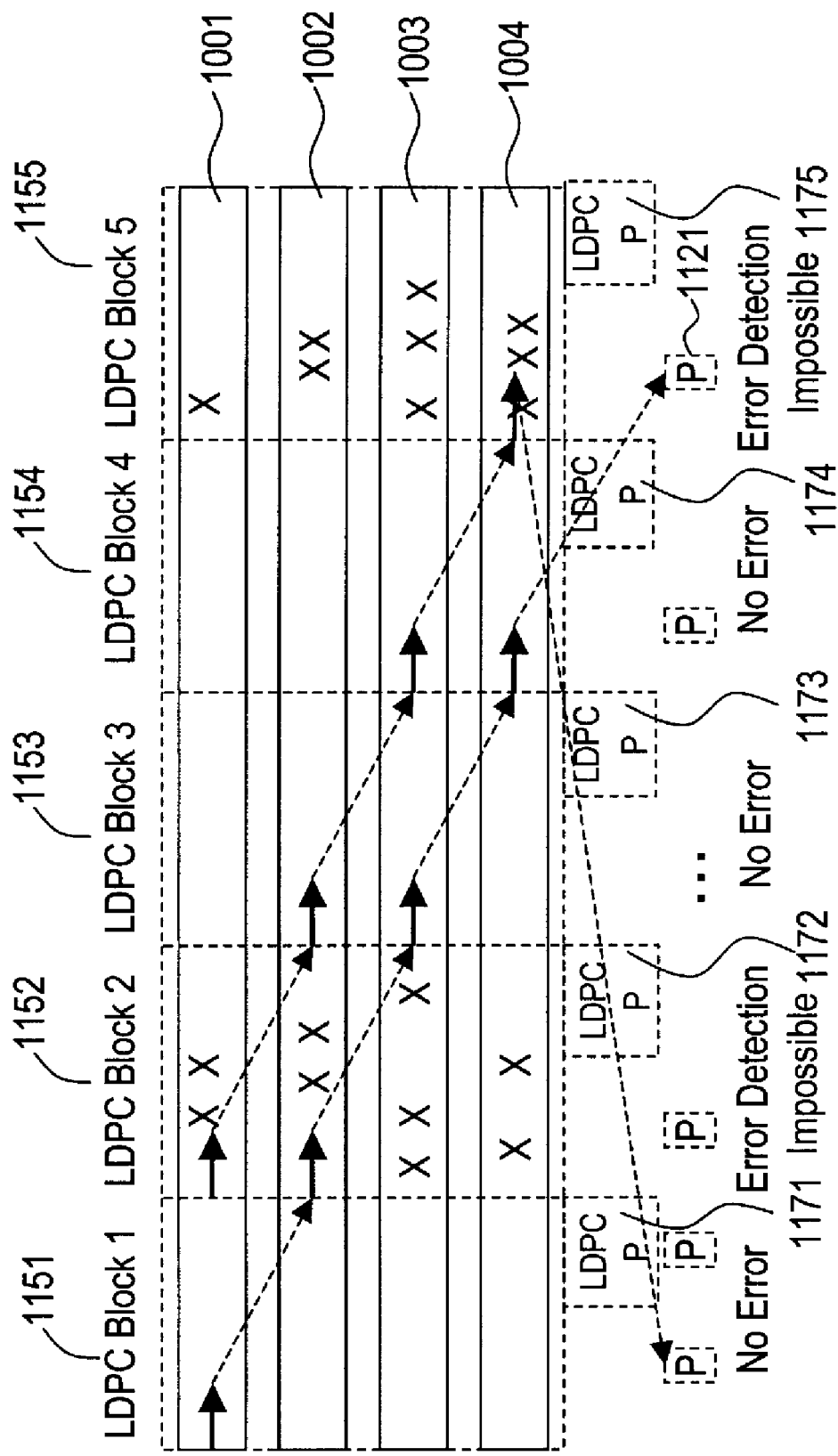
FIG. 7 is a diagram depicting a relationship of each parity code in FIG. 2.
Figure 8:
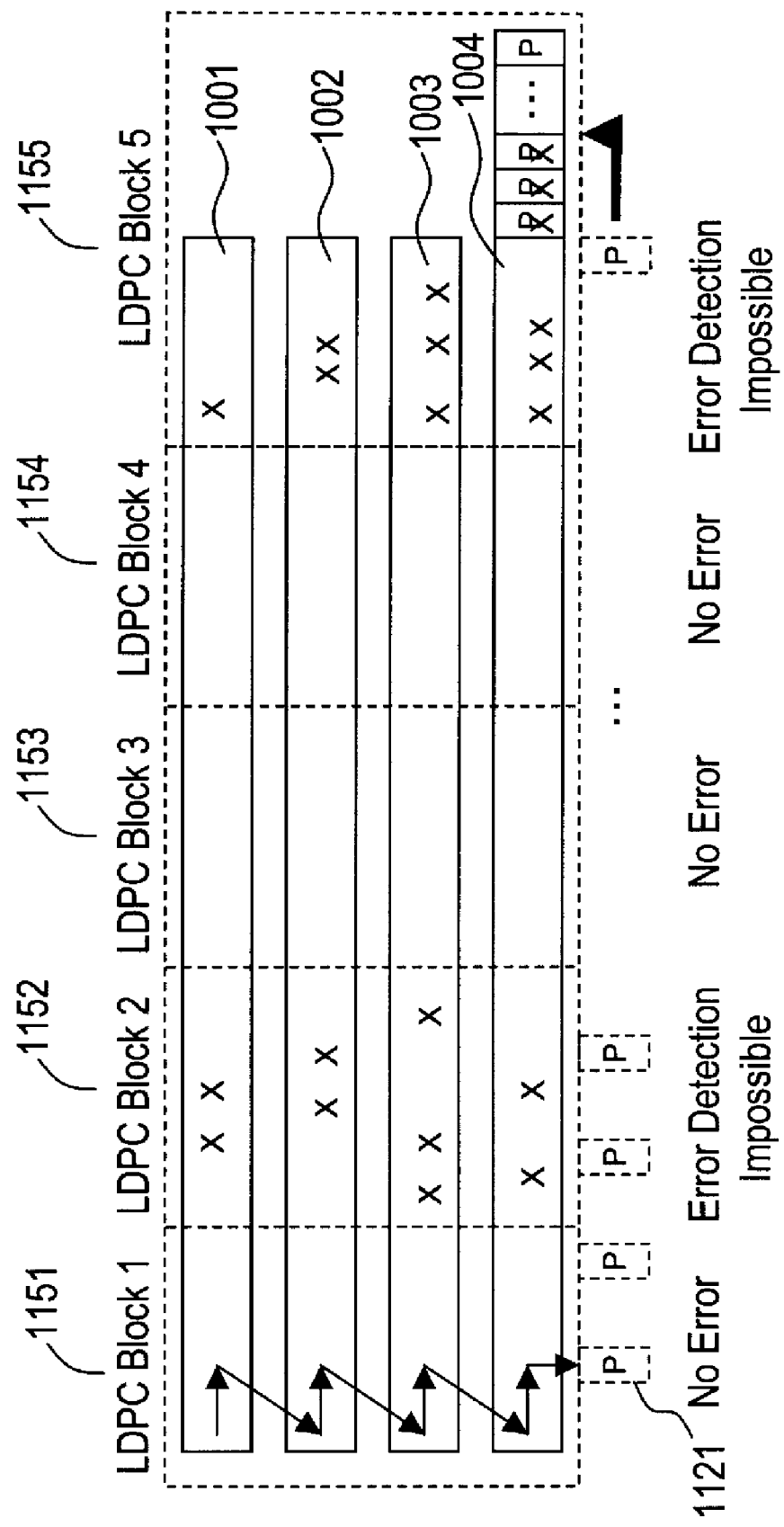
FIG. 8 is a diagram depicting a relationship of each parity code in the comparison example of FIG. 7.

Configurations of the ECC encoder, parity encoder and LDPC encoder in FIG. 1 will now be described. FIG. 2 is a block diagram of the ECC encoder 235, parity encoder 234 and LDPC encoder in FIG. 1. FIG. 3 is a diagram depicting the operation of the interleave unit in FIG. 2. FIG. 4 is a diagram depicting the operation of the ECC encoder and de-interleave unit in FIG. 2. FIG. 5 is a diagram depicting the operation of the parity encoder in FIG. 2. FIG. 6 is a diagram depicting the operation of the LDPC encoder in FIG. 2. FIG. 7 is a diagram depicting a relationship of the LDPC block, RS block and parities in FIG. 2 to FIG. 6. And FIG. 8 is a diagram depicting a comparison example.

Figure 2:
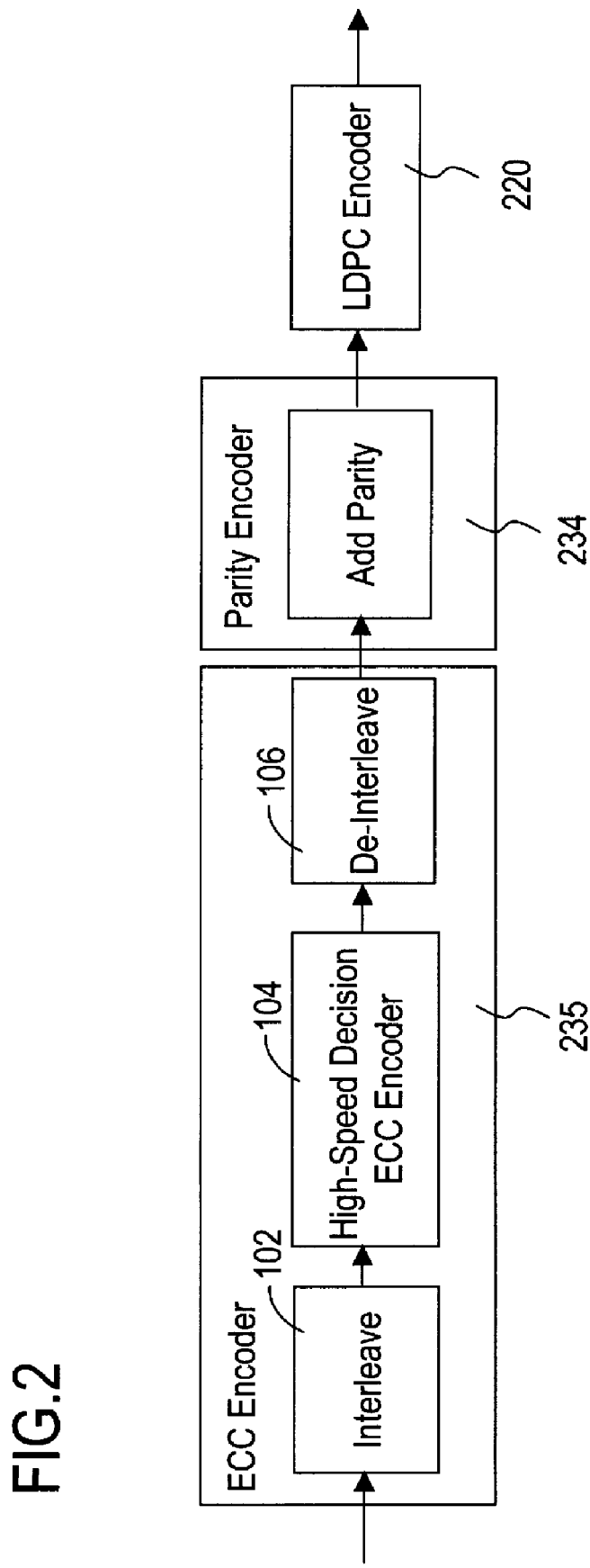
FIG. 2 is a block diagram of the encoder in FIG. 1.

As FIG. 2 shows, the ECC encoder 235 is comprised of an interleave unit 102, ECC encoder 104 and de-interleave unit 106. The interleave unit 102 interleaves a data string 1000 having a 4 kByte sector into 4 (n=4) blocks 1001, 1002, 1003 and 1004 as shown in FIG. 3. This interleave is performed on the sector of data string 1000 with a bit interval of 10 bits (m=10).

The ECC encoder 104 performs ECC encoding on each block 1001, 1002, 1003 and 1004 after being divided into 4, and adds the RS code parities 1011, 1012, 1013 and 1014 to each block 1001 to 1004 respectively, as shown in FIG. 4. It is preferable that the ECC encoder 104 adds (2t+1) symbols of RS parity for the correction of t symbols, so that whether decoding failed can be determined when an error position polynomial is determined.

The de-interleave unit 106 performs a de-interleave processing (reverse operation of interleave) on each block to which RS parity was added, as shown in FIG. 4, with a 10-bit interval, so as to convert these blocks into one data string (RS code string) 1100.

For example, if a 4 kByte sector data string is divided into 4, one block is 1 kBytes. If error correction count "t" is 55 symbols, then (2t+1) symbols (=111 symbols) of RS parity is added.

Figure 5:
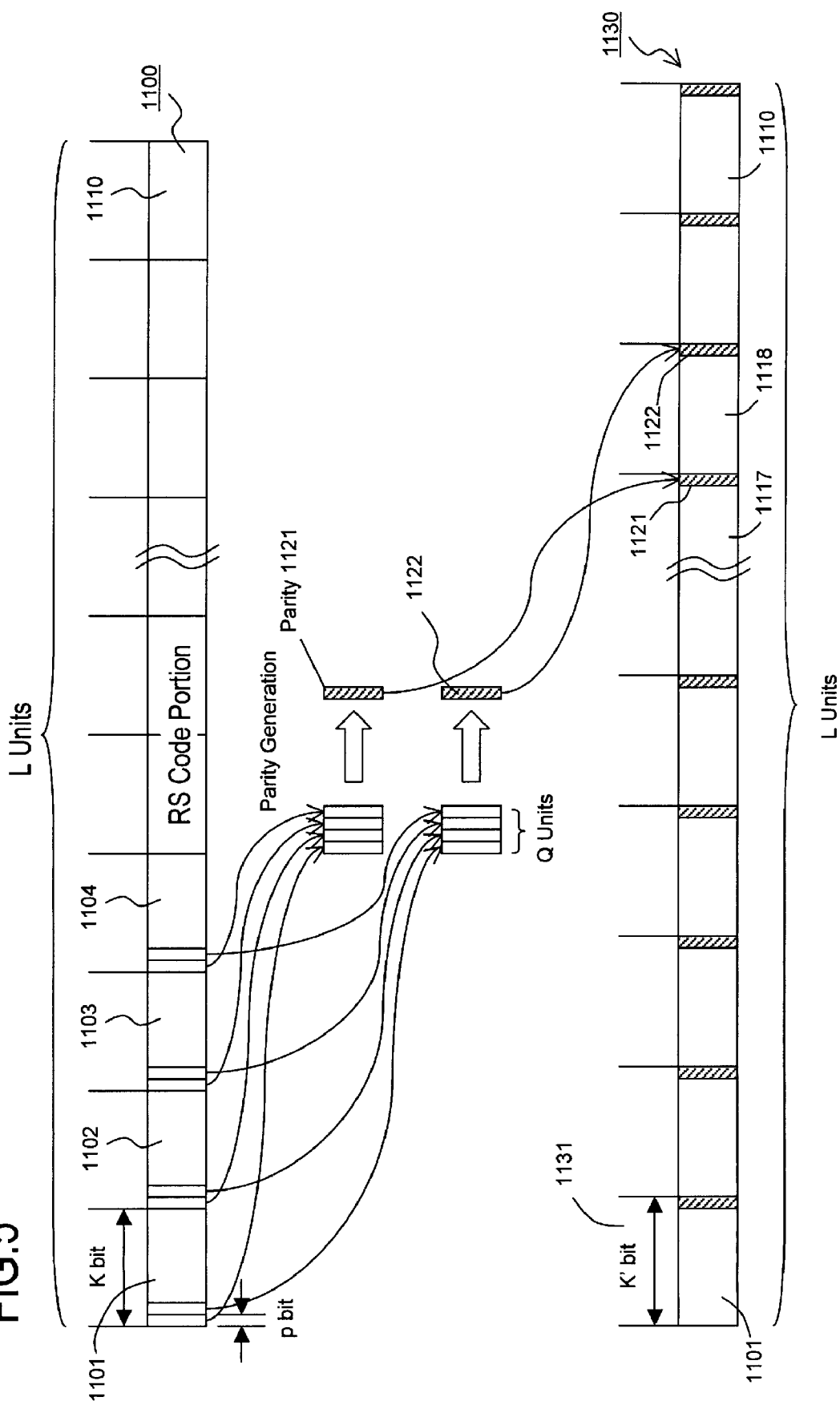
FIG. 5 is a diagram depicting the operation of the parity encoder in FIG. 2.

Then as FIG. 5 shows, the parity encoder 234 extracts 10 bits of a data string (p=10) respectively from q (q≦L) number of (e.g. 4) blocks 1101 to 1104, out of the blocks 1101 to 1110 generated by dividing the RS code string 1100 into L (e.g. 10), and generates parities 1121 and 1122 respectively for each of p×q number of data strings. The generated parities are added to each block 1117 and 1118, which are different from the extracted blocks 1101 to 1110, and data 1130 is output. Here {(K·L)/(p·q)}·2 number of parities are generated.

Then as FIG. 6 shows, the LDPC encoder 220 performs LDPC encoding for K' (data length when RS code string 1100 is divided into L is K bits, as described in FIG. 5, and the data length when a parity is added thereto is K') bits of data strings 1131 to 1140, generated by dividing the RS code string 1130 to which parity was added by the parity encoder 234 into L, respectively, and adds LDPC code parities 1171 to 1180 to each block 1131 to 1140 respectively.

By extracting the parity 1121 added like this from each LDPC block 1151 to 1160, an error can be detected based on the parity, since parities are dispersed in LDPC decoding even if a burst error occurs.

This error detection will now be described with reference to FIG. 7 and FIG. 8. FIG. 7 is a diagram depicting a case when the parities are created and added such that the parities are dispersed as shown in the embodiment in FIG. 5, and FIG. 8 is a diagram depicting a case when the parities are created and added such that the parities are not dispersed unlike in the embodiment in FIG. 5.

In some cases, LDPC may not be able to correct errors in an LDPC block, and generate many errors due to a correction error, even though this probability is low. FIG. 8 shows a diagram depicting parities generated based on the LDPC blocks 1151 to 1155, RS code blocks 1001 to 1004 and interleaved bit strings. This is a combination of the method shown in the above mentioned Document by ITO TOSHIO et al. and LDPC, where the ECC encoder adds the RS parities 1011, 1012, 1013 and 1014 to the four blocks 1001, 1002, 1003 and 1004 generated by interleave with a bit interval of 10 bits. For the 10 bits×4 (4 blocks)=40 bits of vertical direction, 2 bits of parities 1121 to 112n are calculated and added by the parity encoder 234. Therefore the codes to be generated are the error correction codes based on RS codes in the horizontal direction, and are the concatenated type codes using the error detection codes based on multi-parity (2-bit parity) in the vertical direction.

However as FIG. 8 shows, if the LDPC blocks are correctly decoded (blocks 1151, 1153 and 1154), there is not error, so the parities 1121 have no effect.

If the LDPC blocks are decoded with error (block 1152, 1155), on the other hand, many errors (indicated by x in FIG. 8) are generated, and errors cannot be detected correctly by the parities. As a result, error detection based on the parities is disabled, and correction using likelihood by ECC cannot be performed, hence an improvement of the error correction capability using RS decoding and parity likelihood and correction cannot be expected.

Whereas in the case of generating parities from the dispersed bit strings of the RS encoding unit 1100, as shown in FIG. 5, one parity is not created with one LDPC block, but by data strings of a plurality of LDPC blocks. Then the parity is inserted into blocks other than the creation target block.

Therefore the codes to be generated are error correction codes based on RS codes in the horizontal direction and error detection codes based on LDPC parities in the vertical direction, and a parity is added in a diagonal direction of the separated RS blocks.

Therefore as mentioned later, errors can be detected correctly using the parities, even if many errors (indicated by x in FIG. 7) are generated in the case of decoding LDPC blocks (blocks 1152, 1155) in error.

In FIG. 8, on the other hand, where LDPC parities and the parities to be added are in same vertical directions, many errors are generated, and errors cannot be detected correctly using the parities if LDPC blocks (blocks 1152, 1155) are decoded in error, as mentioned above.

(Decoder)

Figure 9:
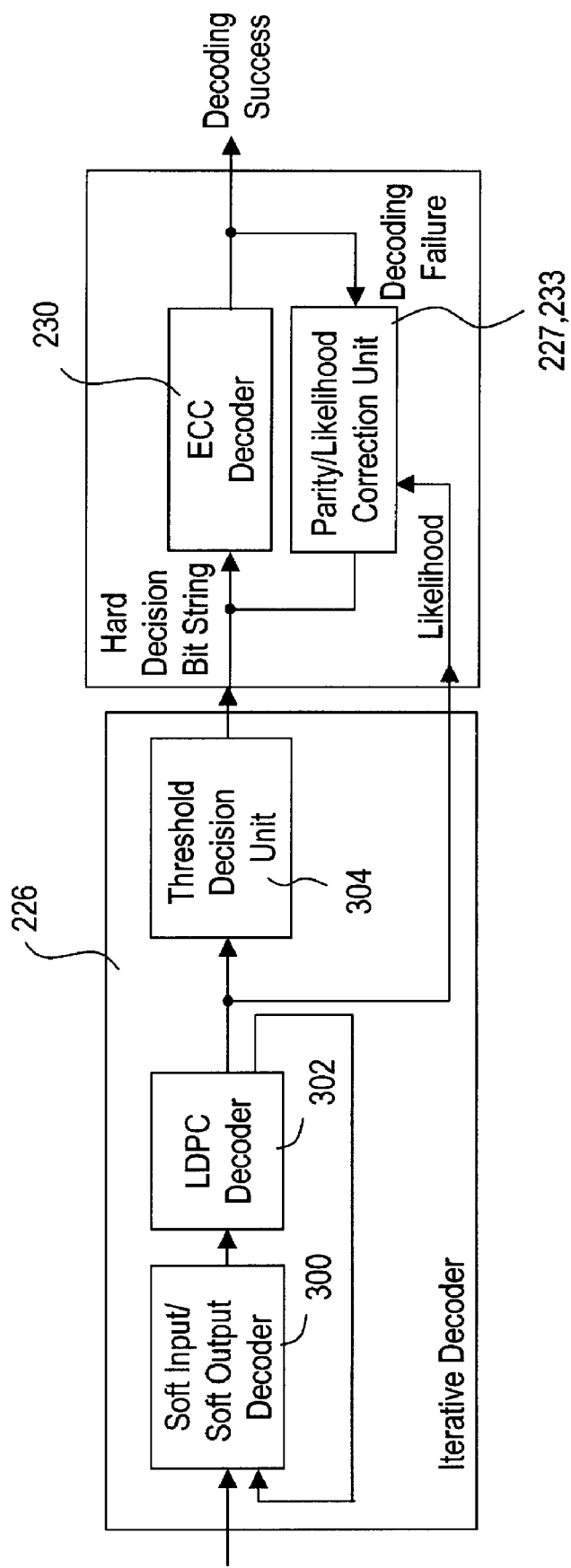
FIG. 9 is a block diagram depicting a basic configuration of the decoder in FIG. 2.
Figure 10:
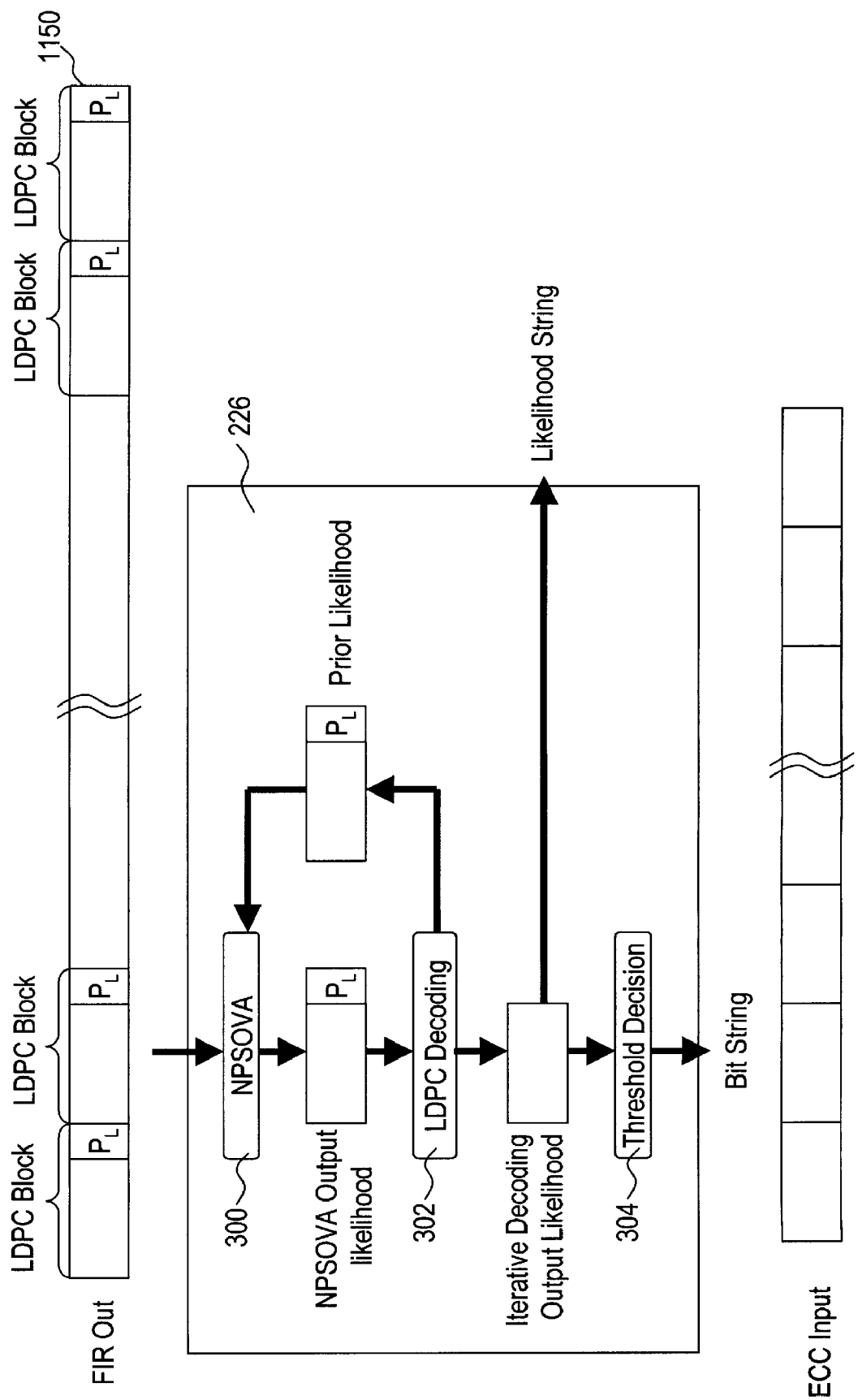
FIG. 10 is a detailed block diagram depicting an iterative decoder in FIG. 9.
Figure 11:
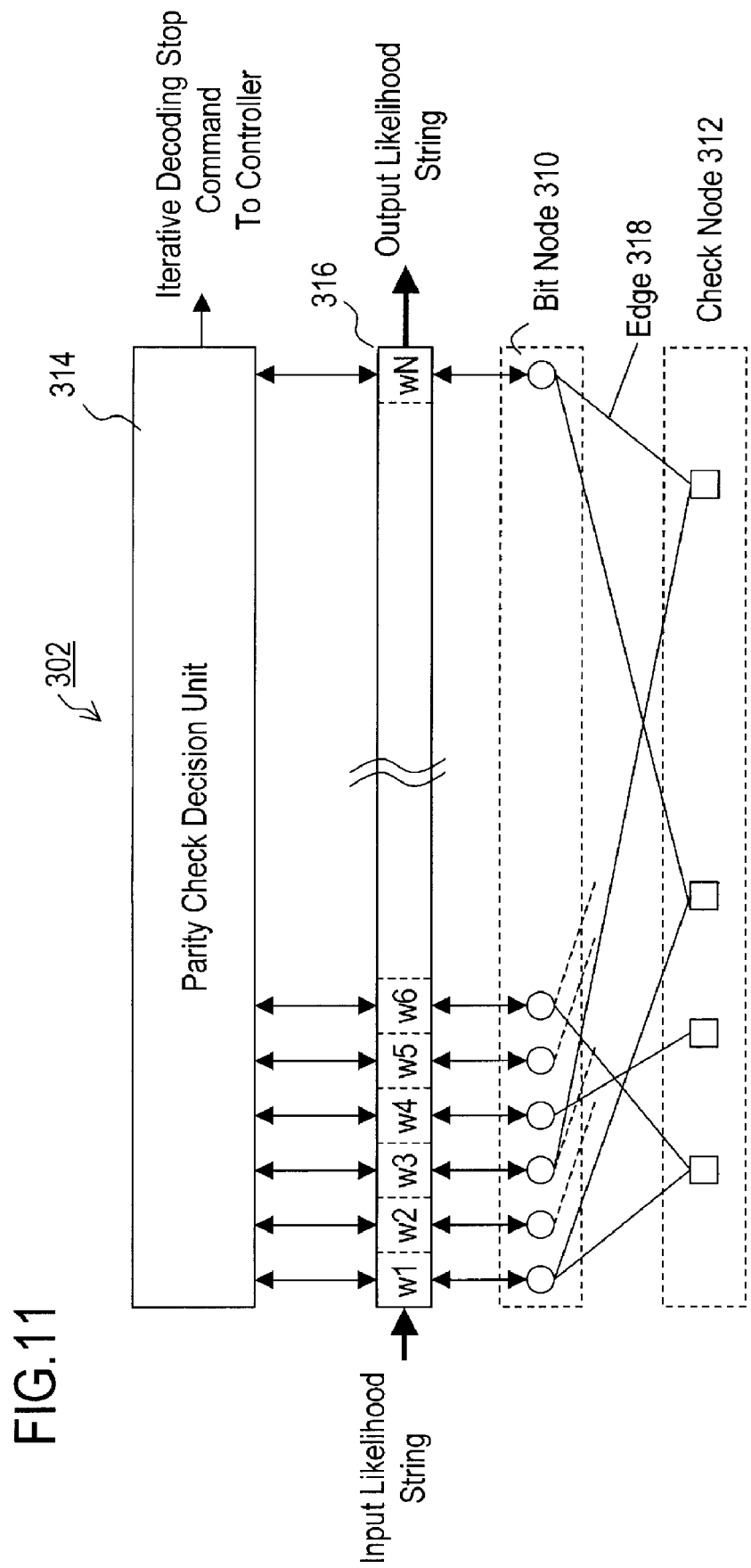
FIG. 11 is a diagram depicting an LDPC decoder in FIG. 10.

FIG. 9 is a block diagram depicting a basic configuration of the decoder in FIG. 1, FIG. 10 is a detailed block diagram depicting an iterative decoder in FIG. 9, and FIG. 11 is a diagram depicting an LDPC decoder in FIG. 9 and FIG. 10.

As FIG. 9 shows, the iterative decoder 226 is comprised of a soft input soft output decoder 300, LDPC decoder 302 and threshold decision unit 304. The soft input soft output decoder 300 can use a plurality of practical algorithms, as mentioned above, but uses NPSOVA in this example.

FIG. 10 is a diagram depicting a decoding flow of the iterative decoder 226 in FIG. 9. As FIG. 10 shows, the iterative decoder 226 decodes each LDPC block. The output data string of the FIR filter 225 (see FIG. 1) and the prior likelihood of the LDPC decoder 302 are input to the NPSOVA 300. The entire prior likelihood is "0" in the initial iterative decoding. The prior likelihood is a likelihood string generated by subtracting the input likelihood of the LDPC decoder 302 from the output likelihood of the LDPC decoder 302 (that is, the update value of likelihood in the LDPC decoder 302).

The NPSOVA 300 performs decoding using the output data string of the FIR filter 225 and the prior likelihood. The output likelihood string from the NPSOVA 300 is a likelihood string generated by subtracting the prior likelihood from the likelihood obtained by decoding. This NPSOVA output likelihood string is sent to the LDPC decoder 302.

The LDPC decoder 302 can also use the plurality of practical algorithms mentioned above, but uses the Sum-Product algorithm in this example. As described in FIG. 11, the Sum-Product algorithm performs reliability propagation decoding to be described below, according to the LDPC parity check matrix. In other words, if the iterative decoding stopping conditions are not satisfied, the LDPC decoder 302 outputs the prior likelihood, and inputs it again to the NPSOVA decoder 300 to perform iterative decoding.

The iterative decoder 226 performs iterative decoding using likelihood between the NPSOVA 300 and the LDPC decoder 302 for each LDPC block, for a predetermined number of times or until the stopping conditions to determine no error are satisfied as a result of the parity check. When the iterative decoding stops, the threshold decision unit 304 determines the likelihood string to be a hard decision bit string of "0" or "1".

The Sum-Product algorithm used for the LDPC decoding will now be described with reference to FIG. 11. The Sum- Product algorithm is comprised of a parity check decision unit 314, a buffer 316 for storing N number of likelihood strings w1 to wN of the LDPC block, a bit node 310 corresponding to the N number of likelihood strings w1 to wN, an edge 318 which is generated based on the check conditions of the parity check matrix, and check node 312.

The likelihood transferred from the buffer 316 to the bit node 310 is collected in the check node 312 along the edge 318, and check node processing is performed in the check node 312.

The likelihood after the check node processing is performed is sent to the bit node 310 again, and the bit node 310 performs the bit node processing using a likelihood collected in the bit node 310 linked with each check node 312. Here the obtained likelihood string is input to the parity check decision unit 314 every time the bit node processing is performed.

The parity check decision unit 314 temporarily determines the likelihood string as binary values "1" or "0", and judges whether the check conditional expression (1) $wH^T=0$ of the temporarily decided bit string and parity check matrix satisfies. If the check conditional expression establishes as a result of the judgment, the reliability propagation decoding and iterative decoding are stopped (an iterative decoding stop command is output to the controller). For the output likelihood string, polarities held by the likelihoods at the parity check decision are kept, and positive or negative maximum likelihood values are used.

If the above mentioned check conditional expression is not satisfied, the parity check decision unit 314 performs a predetermined check node and bit node processing a plurality of times in the reliability propagation decoding, and the obtained likelihood string is regarded as the output likelihood string.

The iterative decoding is performed for each LDPC block, and the hard decision bit string which is output from the threshold decision unit 304 is input to the ECC decoder 230, and the likelihood string is input to the parity likelihood correction units 227 and 233. As mentioned later, the ECC decoder (RS decoder) 230 receives the hard decision bit string, interleaves it into 4, performs ECC decoding on each block, and outputs the decoded string if decoding succeeds.

The parity/likelihood correction units 227 and 233 select and hold the bit positions of which likelihood is low based on the likelihoods from the iterative decoder 226. When decoding of the RS decoder 230 fails, the error positions are extracted from the bit positions of which likelihood is low which have been held, data in these positions of the bit string are flipped and input to the RS decoder 230. When decoding fails, this processing is repeated so as to increase correction capability.

(ECC Decoder)

FIG. 12 is a block diagram depicting the ECC decoding unit in FIG. 1 and FIG. 9. As FIG. 12 shows, the ECC decoding unit 230 is comprised of an RS code portion/parity portion separation unit 110, interleave unit 112, data storage/update unit 114, ECC decoder 116 and de-interleave unit 118.

The ECC decoder 116 is further comprised of a syndrome value calculation unit 260, syndrome value storage unit 262, syndrome value update unit 264, error position polynomial creation unit 266, chain search execution unit 268 and error value calculation unit 270.

The syndrome value calculation unit 260 calculates a syndrome of a decoded string from the decoder 226, and the syndrome value storage unit 262 stores the calculated syndrome value. The error position polynomial creation unit 266 calculates an error position polynomial from the created syndrome polynomial, and judges whether the result exceeds a correction capability.

The syndrome value update unit 264 calculates a syndrome value of an updated portion of the bit string of which data was updated by the parity/likelihood correction unit 233, and updates the syndrome value stored in the syndrome value storage unit 262.

The chain search execution unit 268 determines an error position by chain search if the error position polynomial creation unit 266 determined that decoding will not fail. When it is determined that decoding will not fail in a chain search, that is, when error positions are specified in the chain search, the error value calculation unit 270 calculates error values.

As described above, a previous syndrome value is stored, and if decoding fails, a syndrome value of the corrected portion of the decoded string, which is corrected by the parity/likelihood correction unit 233, is calculated and the previous syndrome value is updated by the syndrome value. Therefore it is unnecessary to calculate the whole syndrome value for this corrected portion of the bit string again, so the calculation volume can be reduced.

Also as mentioned later, whether decoding failed or not can be determined in the stage where the error position polynomial is calculated, so if decoding fails, the next bit string can be decoded, and the calculation volume can be reduced.

The parity/likelihood correction unit is comprised of a first parity/likelihood correction unit 227 and a second parity/likelihood correction unit 233. The first parity/likelihood correction unit 227 receives the likelihood of each bit from the decoder 226, and extracts a bit position where likelihood is low, for each block of 4 interleaves.

The second parity/likelihood correction unit 233 is comprised of a parity calculation unit 120, parity value check unit 122, error candidate table storage unit 124 and error flip unit 126.

The first parity/likelihood correction unit 227 separates the likelihoods into the likelihoods of a block portion and the likelihoods of a parity portion, and holds the separated likelihoods in a table. Then the first parity/likelihood correction unit 227 extracts the bit positions of which likelihood is low in a block portion, and sorts the bit positions in a sequence of lower likelihood in a parity portion.

As the absolute value of the likelihood becomes higher, the probability that a bit is correct becomes higher, and as the absolute value of the likelihood becomes lower, the probability that the bit is in error becomes higher. In order to extract bits of which the error probability is high, only bits of which likelihood is low are handled. This result is output to the second parity/likelihood correction unit 233.

In the ECC decoder 230, the separation unit 110 separates the hard decision bit string into an RS code portion and a 2-bit parity portion. All the separated 2-bit parities are output to the parity value check unit 122 of the second parity/likelihood correction unit 233.

Then the interleave unit 112 performs interleave on the separated RS code portion with a 10-bit interval, so as to divide the portion into the above mentioned 4 RS blocks. In other words, processing, the reverse of de-interleave of the encoding in FIG. 4, is performed.

Each of the separated RS blocks is stored in the data storage/update unit 114, and is then decoded by the ECC decoder 116. If decoding succeeds in all the RS blocks as a result of decoding, the de-interleave unit 118 removes the RS parities 1011 to 1014 from each RS block, then performs de-interleave processing with a 10-bit interval, and outputs the sector data 1000, and ends the processing.

If decoding fails in some of the RS blocks as a result of decoding, all the RS block numbers, for which decoding failed, are output from the ECC decoder 230 to the second parity/likelihood correction unit 233. The de-interleave unit 118 performs de-interleave processing with a 10-bit interval without removing the RS parities 1011 to 1014 from each RS block 1001 to 1014, and outputs the original RS code portion 1100, which is the result of the de-interleave processing, to the second parity/likelihood correction unit 233.

Now the ECC decoder 116 will be described. The syndrome calculation unit 260 calculates a syndrome polynomial (coefficients of polynomial s1, s2, . . . ) of the data string, and outputs the calculated syndrome polynomial to the error position polynomial calculation unit 266. In this case, values of (2t+1) number of syndrome coefficients si (i=1, 2, . . . , 2t, 2t+1) are calculated. At the same time, the syndrome calculation unit 260 stores the calculated syndrome polynomial in the syndrome value storage unit 262 so as to be used for the second or later candidate decoding processing.

The error position polynomial calculation unit 266 calculates the syndrome polynomial based on the Berlekamp Massey (BM) method. In the Berlekamp Massey method, the error position polynomial is calculated by repeating the update of the polynomial for a number of times, the same as the degree of the generating polynomial, starting with the initial value of the polynomial. In this case, in order to decrease the i-th polynomial Ci (x), the value of the i-th syndrome si is required.

The error position polynomial calculation unit 266 generates the (2t)-th polynomial C2t (x) and (2t+1)-th polynomial C2t+1 (x). Then the error position polynomial calculation unit 266 compares the coefficients of the (2t)-th polynomial C2t (x) and the (2t+1)-th polynomial (C2t+1 (x), and judges whether these two polynomials match.

In the Berlekamp Massey method, if the number of errors included in the data string is k (k≦t), the polynomial is not updated in the (2k+1)-th or later repeat, and C2t (x) or later polynomials all become the same. Therefore if C2t (x) and C2t+1 (x) match, the number of errors is at most t, which is within a scope of error correction capability. If C2t (x) and C2t+1 (x) do not match, on the other hand, the number of errors exceed the error correction capability.

Therefore it is determined that the correction of this candidate will succeed if C2t (x) and C2t+1 (x) match, and the data string, syndrome polynomial, error position polynomial and decision result are output to the chain search execution unit 268. If C2t (x) and C2t+1 (x) are different, it is regarded as a failure of correction of the candidate, and a flag to indicate a decoding failure is set in the currently decoding RS block, and this block number in the second parity/likelihood correction unit 233 is output.

In this way, a data string correction failure can be detected in the middle of decoding by adding an extra parity of one symbol to the data string, and calculating an extra polynomial in the Berlekamp Massey method. A format of adding an extra parity of several symbols may be used.

If it is determined that the decoding will not fail, error correction is determined by a chain search. In other words, the chain search execution unit 268 executes a chain search using the error position polynomial C (x), and calculates the values of C ($\alpha^j$) (j=0, 1, 2, 3, 4, . . . , n) to all positions j on the data string. Position j, where C ($\alpha^j$)=0 is satisfied, is an error position.

Then the chain search execution unit 268 judges the success of a correction using the syndrome polynomial and the value of C ($\alpha^j$), and if it is determined that the correction will succeed, the chain search execution unit 268 outputs the received data string, syndrome polynomial, and error position polynomial to the error value calculation unit 270. If it is determined that the correction will fail, a flag of the decoding failure is set in the currently decoding RS block, and this block number in the second parity/likelihood correction unit 233 is output.

If an error position is specified in the chain search, the error value is calculated. In other words, the error value calculation unit 270 corrects an incorrect value at the error position of the data string into a correct value based on a predetermined algorithm using the syndrome polynomial and error position polynomial. And the data string after correction is output to the de-interleave unit 118.

In other words, if decoding succeeds, the corrected data string is output from the ECC decoder 230. If the correction fails and a second or later decoding is required, decoding processing is performed using the information stored in the syndrome value storage unit 262.

Then as mentioned later, the error location is flipped in the second parity/likelihood correction unit 233, whereby the data in the data update/storage unit 114 is updated and stored. For this updated RS block, the syndrome value update unit 264 calculates the syndrome corresponding to the location where data is updated, updates the syndrome value stored in the storage unit 262, and outputs the updated syndrome polynomial to the error position polynomial calculation unit 266.

Hereafter as mentioned above, the error position polynomial calculation unit 266 creates the error position polynomial, and if it is determined that decoding is a failure, a flag to indicate failure of decoding is set in the current RS block, and the block number is output to the second parity/likelihood correction unit 233. If it is determined that decoding is not a failure, an error position is determined by the chain search execution unit 268. If it is determined that decoding is a failure in a chain search, a flag to indicate failure of decoding is set in the current RS block in the same way, and the block number is output to the second parity/likelihood correction unit 233. If an error position is specified in the chain search, the error value is calculated.

For the flipped bit string, it is unnecessary to calculate the whole syndrome value for this corrected portion of the bit string again, so calculation volume can be reduced. Also whether decoding failure or not can be determined in the stage where the error position polynomial is calculated, so if decoding fails, processing can move onto the next step, and calculation volume can be reduced. In this way, the ECC decoder 116 can decrease calculation volume even more than conventional ECC decoders, and can perform high-speed decoding.

After all the RS block numbers where decoding failed and RS code portion 1100 (see FIG. 4), for which de-interleave processing was performed, are input to the second parity/likelihood correction unit 233, a parity is calculated just like the parity encoder in FIG. 2 and FIG. 5.

In other words, the parity calculation unit 120 in FIG. 12 extracts bit strings in the diagonal direction with respect to the RS code portions 1100 to 1113, as shown in FIG. 5, and calculates the 2-bit parity, as shown in FIG. 5 and FIG. 7.

The parity value check portion 122 checks parity values whether the parity value generated by the parity encoder sent from the separation unit 110 and the recalculated parity value match. A parity block string, of which value matches in the parity check, is determined as no error, and a parity block string of which value does not match is determined as an error.

The error flip unit 126 in FIG. 12 detects an error position in the block based on the parity check result and decoding failure block number, calculates the parity error value, refers to the table 124 using the parity error value to specify the error position, and flips the bit value of the error position.

Since an error position can be detected, a performance that exceed one interleave ECC can be implemented.

By combining with the ECC decoder 116 in FIG. 12, the speed of determining the impossibility of correction of the ECC decoder and the speed of creating a syndrome of the decoding target data string can be increased, and decoding with low calculation volume can be enabled.

(Encoding and Decoding Operation)

Figure 13:
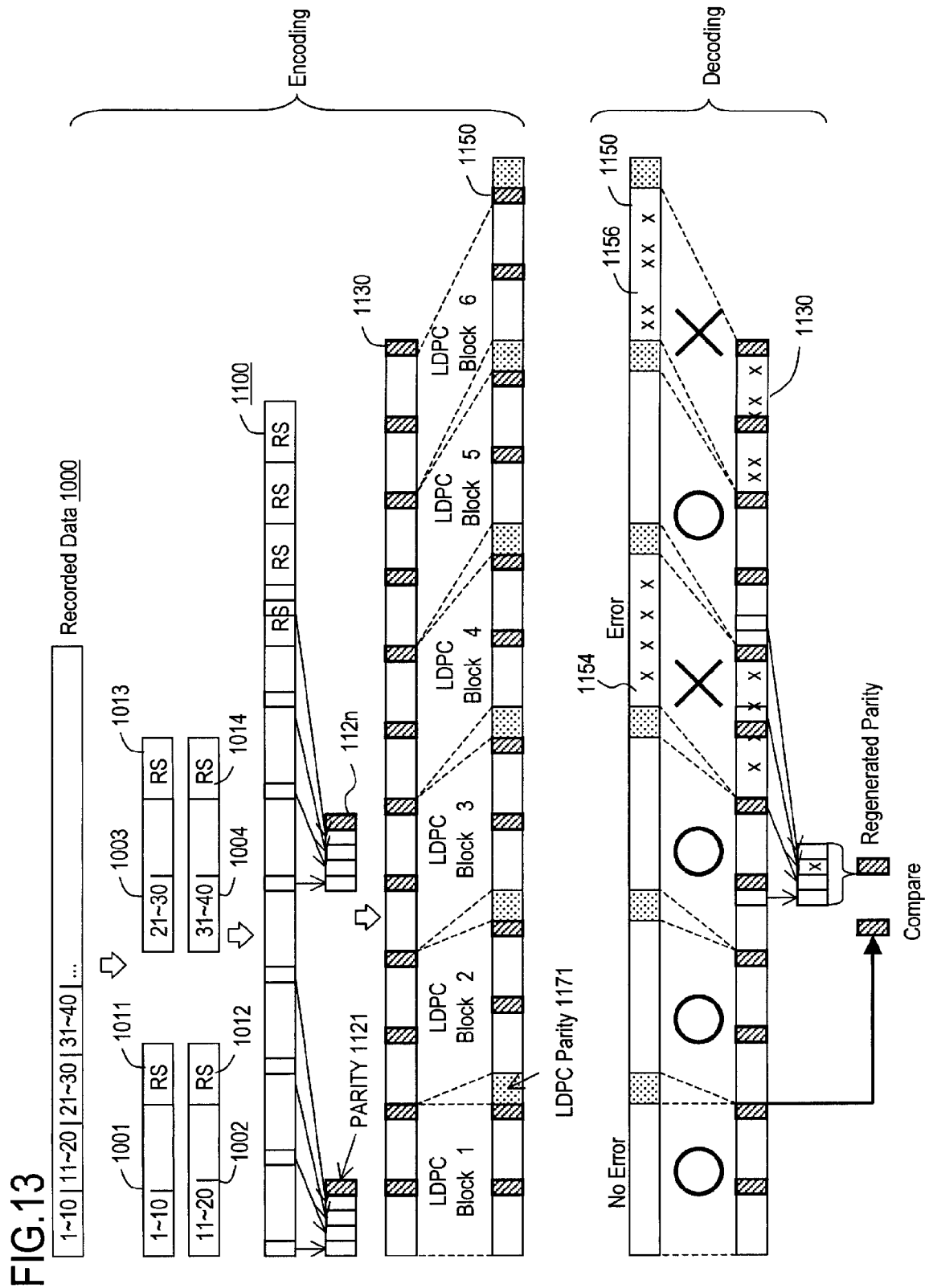
FIG. 13 is a diagram depicting encoding and decoding according to an embodiment of the present invention.
Figure 14:
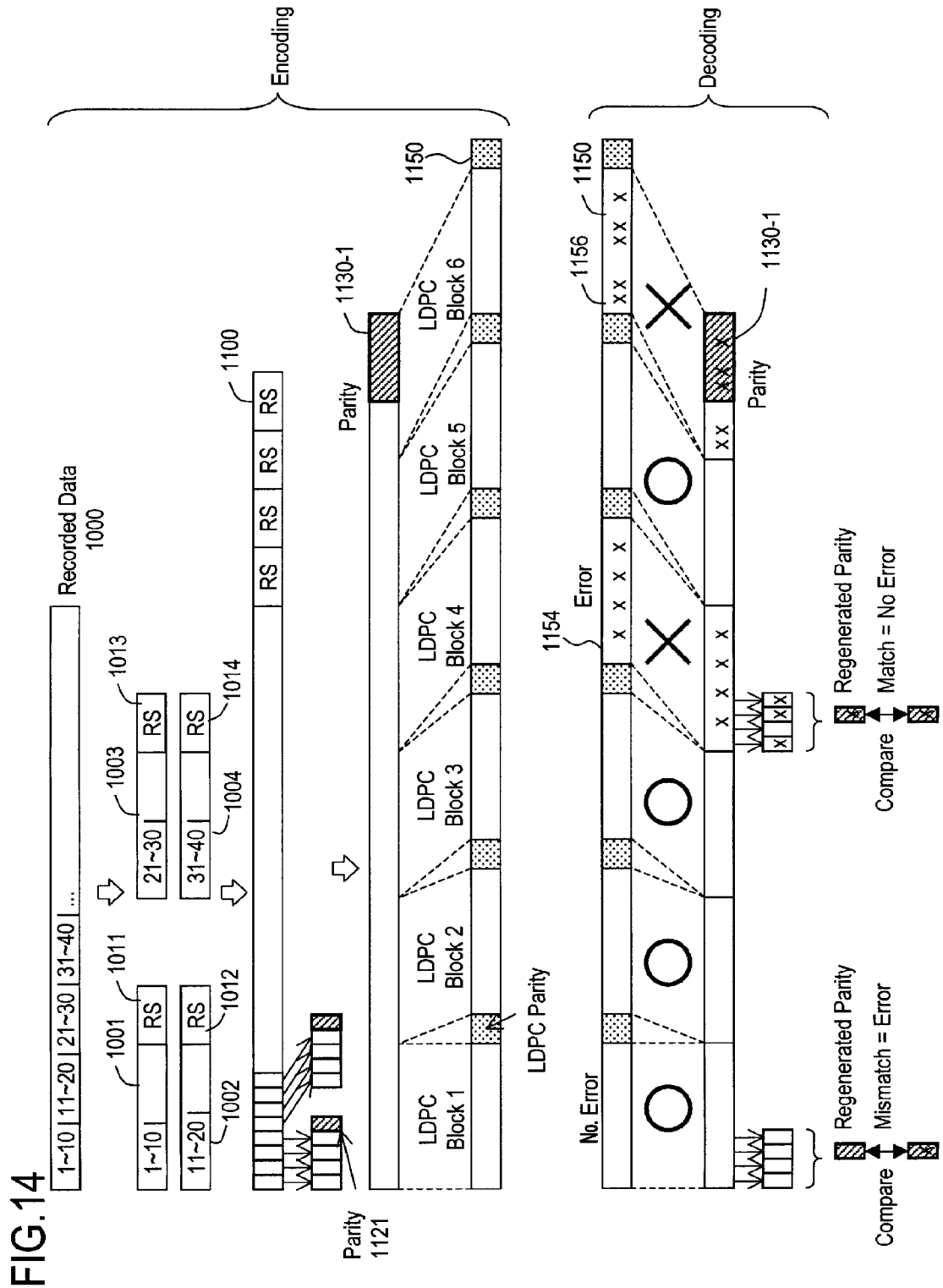
FIG. 14 is a diagram depicting encoding and decoding in the comparison example according to the present invention.

FIG. 13 is a diagram depicting encoding and decoding according to an embodiment of the present invention, and FIG. 14 is a diagram depicting encoding and decoding when a technology disclosed in the above mentioned Document by Ito et al. and LDPC are used, shown as a comparison example.

As FIG. 13 shows, in the case of encoding, the RS encoded string 1100 is created by interleaving the recording data 1000, performing RS encoding (1001 to 1004) and de-interleaving the encoded result. Then as FIG. 5 shows, a 10-bit string (p=10) is extracted from q (q≦L, e.g. 4) blocks 1101 to 1104, out of blocks 1101 to 1110 generated by dividing the RS code string 1100 into L (e.g. 10) respectively, so as to generated the parities 1121 and 1122 for each of the p×q number of data strings. The generated parities are attached to each block 1117 and 1118, which are different from the extracted blocks 1101 to 1104, and data 1130 is output.

Then as FIG. 6 shows, LDPC encoding is performed for each K' bit data string 1131 to 1140 generated by dividing the RS code string 1130, to which the parities were added, into L, and LDPC code parities 1171 to 1180 are added to the blocks 1131 to 1140 respectively.

In the case of decoding, LDPC decoding is performed on the LDPC encoded block 1150, and the RS code data string 1130 is obtained. Even if an LDPC block is decoded with error during the decoding (blocks 1154, 1156), and many errors (indicated by x in FIG. 13) are generated, error detection based on parities can be correctly performed.

In other words, in the ECC decoder, an RS block in which an error was detected is specified, and the parity is recreated based on a plurality of RS blocks including the RS block which created the parity, according to the positional relationship of parities described in FIG. 7. A corresponding parity during encoding has been inserted in another predetermined block, so the parity in this position is read and compared. If the comparison result does not match, it is determined that an error exists, and the error candidate with low likelihood in the RS block, for which the error is detected, is flipped, as mentioned above.

Since the presence/absence of an error (whether matching with check conditions or not) in an LDPC block has been known in LDPC decoding, a maximum likelihood which the decoder can take is provided as the likelihood extracted from a block without error. This means that a block without error can be excluded from error candidates. As a result, the parity likelihood correction candidates can be limited.

Figure 15:
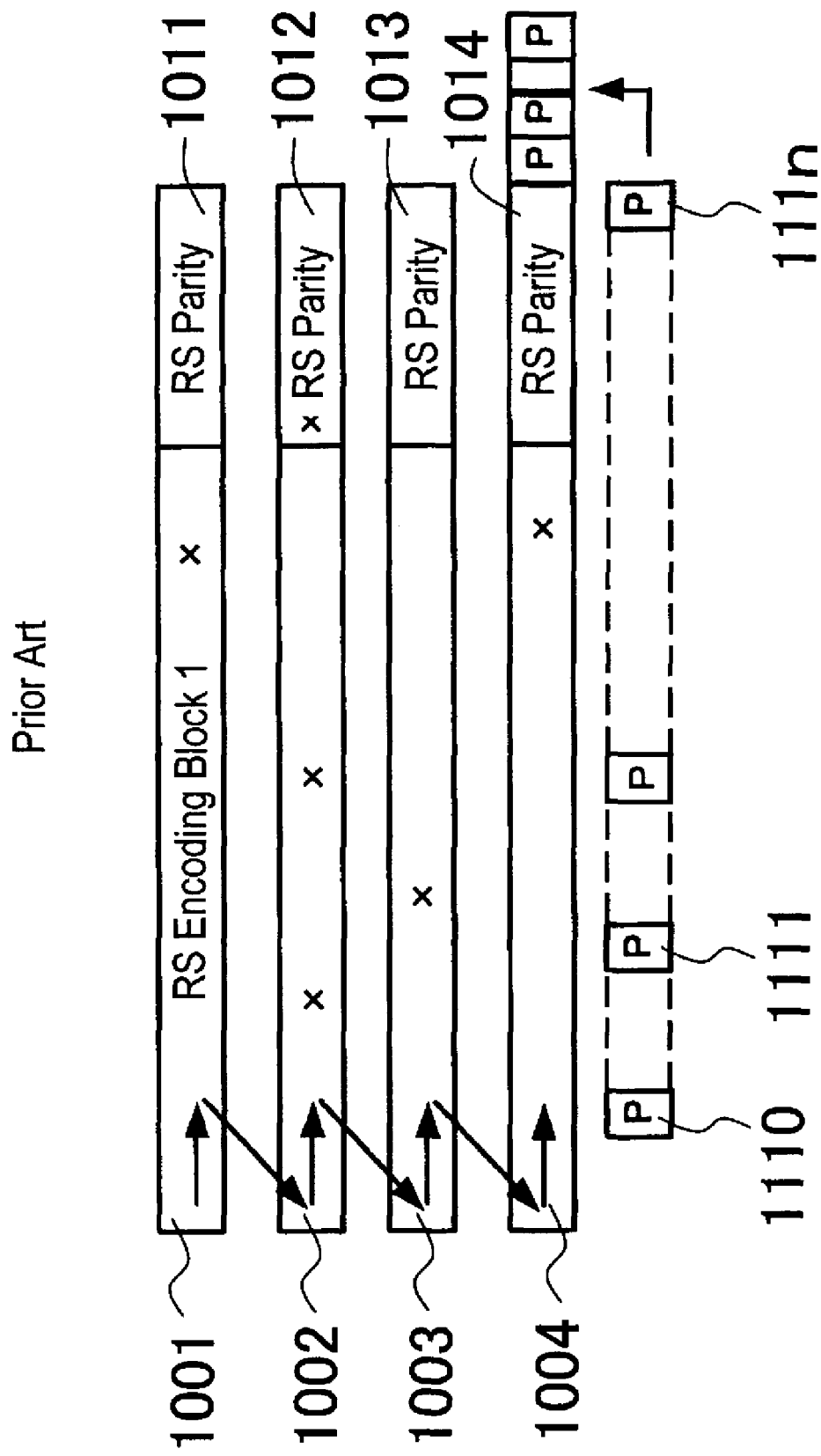
FIG. 15 is a diagram depicting an error correction method combining conventional RS codes and parity codes.

In the case of the comparison example in FIG. 14, in encoding, the RS encoding string 1100 is created by interleaving the recording data 1000, performing RS encoding (1001 to 1004) and de-interleaving. Then as FIG. 15 shows, the parities 1121 and 1122 are generated for the data string after interleaving the RS code string 1100. The generated parities are added to the end of the RS encoded string, and data 1130-1 is output.

Then as FIG. 6 shows, LDPC encoding is performed for each of the K' bit data strings 1131 to 1140 generated by dividing the RS code string 1130, to which the parities were added, into L, and LDPC code parities 1171 to 1180 are added to the blocks 1131 to 1140 respectively.

In the case of decoding, the LDPC decoding is performed on the LDPC encoded block 1150, and RS code data string 1130 is obtained. Then it is assumed that the LDPC block is decoded with error during decoding (blocks 1154, 1156), and many errors (indicated by x in FIG. 14) are generated. In the ECC decoder, the RS block in which an error was detected, recreates the parity based on the target blocks. The parities added to the end of the encoded string are read and compared. If the comparison result does not match, it is determined that an error exists, and an error candidate with low likelihood is flipped, as mentioned above.

However, the parity in encoding is added to the very end of the encoded string, so if this portion is an error, even a block without error becomes a mismatch in the comparison with a regenerated parity, and is regarded as an error. If a parity block has an error, on the other hand, even a block with an error matches in the comparison with the regenerated parity, and is regarded as no error. So if errors concentrate on an LDPC block, correction by ECC becomes impossible.

Other Embodiments

In the above mentioned interleave method in FIG. 2, 10-bits were used as an example, but other numbers of bits can be used, and for the ECC decoder 116 described in FIG. 12, a conventional ECC decoder which does not have the syndrome value storage unit 262 and syndrome value update unit 264 may be applied instead.

In the above embodiment, a Reed Solomon code was used to described the ECC code, but other codes, such as BCH (Bose Chaudhari Hocquengham) code may be used. The interleave was described using a 4-interleave, but the present invention can be applied to a 2 or higher interleave configuration, and the parity was described as 2 bits, but the present invention can also be applied to 1-bit or 3 bits or more. LDPC was described using the second ECC, but another linear encoding method, such as turbo encoding, may be used. The recording/reproducing device of the magnetic disk device was described, but the present invention can also be applied to other media storage devices, such as an optical disk device, and communication devices.

The present invention was described using embodiments, but the present invention can be modified in various ways within the scope of the spirit thereof, and these variant forms shall never be excluded from the scope of the present invention.

A data string is interleaved into a plurality of blocks at every m (m≧2) bits, error correction code parity is added, and concatenated type encoded data, where a parity bit is added to every plurality of bits, is created, so an increase of circuit scale can be prevented. Also a second error correction encoding, which is a linear encoding using iterative decoding, is used in tandem, so an error of ECC input can be corrected by iterative decoding, and deterioration of correction performance can be prevented. As a result, error correction performance can be improved while preventing an increase in circuit scale of a long sector type recording/reproducing device which is used for Windows'® Vista®.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. An encoder, comprising:
    an ECC encoder which interleaves a data string into n (n≧2) blocks of data strings at every m (m≧2) bits, generates a first error correction code parity from the data string of each of said interleaved blocks, and adds said first error correction code parity of each block to said data string to create an error correction code word;
    a parity encoder which creates a parity bit at every plurality of bits of said error correction code word, and adds the parity bit to said error correction code word; and
    a second ECC encoder which divides a second error correction code word in which a parity generated by said parity encoder is added to said error correction code word, into L (L≧2) number of blocks of data strings at every K (K≧2) bits, generates a second error correction code parity, which is a linear code, in said block units, from the data string of each block, and adds said second error correction code parity of each block to said second error correction code word to create a third error correction code word.

2. The encoder according to claim 1, wherein said second ECC encoder creates a third error correction code word, which satisfies a requirement of a low density parity check (LDPC) code, in which a number of "1s" in a parity check matrix is low (low density) and the code is a linear code, and generates a parity using a generation matrix corresponding to said parity check matrix.

3. The encoder according to claim 1, wherein said parity encoder divides said error correction code word into L (L≧2) number of blocks, extracts q (q≧2) number of data strings in p (p≧1) bit units from each of said divided blocks, and generates parities for p×q number of data strings.

4. The encoder according to claim 3, wherein said parity encoder adds said parities generated for said p×q number of data strings to blocks other than said blocks that include the data strings used for the generation of said parities.

5. The encoder according to claim 1, wherein said ECC encoder comprises:
    an interleave unit which interleaves said data string into n (n≧2) blocks of data strings at every m (m≧2) bits;
    an ECC encoding unit which generates an error correction code parity from the data string of each of the interleaved blocks; and
    a de-interleave unit which de-interleaves the data string of each of said blocks at every said m bits, restores the de-interleaved data string back to said data string, and adds a parity of said error correction code to said restored data string.

6. The encoder according to claim 1, wherein said ECC encoder generates a Reed Solomon code as said error correction code.

7. A decoder for decoding the encoded data encoded into the third error correction code word according to claim 1, comprising:
    an iterative decoder which iteratively decodes the received encoded data string using the second ECC code parity, decodes said encoded data string into a bit string, and outputs likelihood of each bit; and
    an ECC decoding circuit which iteratively performs error correction decoding based on the first error correction code of the encoded data string of said iterative decoder, and said encoded bit string correction decoding based on said likelihood according to error detection based on said parity bit.

8. The decoder according to claim 7, wherein said iterative decoder performs said iterative decoding using said parity of said second error correction code word, from said third error correction code word which satisfies a requirement of a low density parity check (LDPC) code, in which a number of "1s" in said parity check matrix is low (low density) and the code is a linear code, performs hard decision on said encoded data string to be said second error correction code word, and outputs the likelihood of each bit.

9. The decoder according to claim 8, wherein said iterative decoder stops said iterative decoding, and sets the likelihood of each bit in the block of said second error correction code word to a maximum likelihood value, when the block of said second error correction code word satisfies the parity check condition and an error is not detected in the error detection of said second error correction code word based on the parity bit string.

10. The decoder according to claim 7, wherein said ECC decoding circuit comprises:
    an ECC decoder which performs error correction based on said first error correction code of the code bit string from said iterative decoder; and
    a parity/likelihood correction unit which performs error detection based on said parity bit when the decoding by said ECC decoder fails, and corrects said code bit string to be input to said ECC decoder based on said likelihood using the result of said error detection.

11. The decoder according to claim 10, further comprises:
    a separation unit which separates said parity bit from the code bit string from said iterative decoder, and outputs said parity bit to said parity/likelihood correction unit;
    an interleave unit which interleaves said code bit string from which said parity bit has been separated into n (n≧2) blocks of data strings at every said m (m≧2) bits; and
    a data storage unit which stores the data string of each of said interleaved blocks,
    wherein said ECC decoder performs error correction on the data string of each block of said data storage unit based on said error correction code,
    and said parity/likelihood correction unit corrects the data string of said data storage unit.

12. The decoder according to claim 10, wherein when said decoding fails, said parity/likelihood correction unit extracts q (q≧2) number of data strings in p (p≧1) bit units from said L number of blocks including said failed block, regenerates parities for p×q number of data strings, and compares the parities with said added parity bits to detect errors.

13. The decoder according to claim 10, wherein said parity/likelihood correction unit extracts parities added to blocks other than said blocks that include the data stings used for the generation of said parities, and compares the parities with said regenerated parities.

14. The decoder according to claim 7, wherein said error correction code of said encoded data string is a Reed Solomon code.

15. An encoding/decoding device, comprising:
    an ECC encoder which interleaves a data string into n (n≧2) blocks of data strings at every m (m≧2) bits, generates a first error correction code parity from the data string of each of said interleaved blocks, and adds said first error correction code parity of each block to said data string to create an error correction code word;

a parity encoder which creates a parity bit at every plurality of bits of said error correction code word, and adds the parity bit to said error correction code word;

a second ECC encoder which divides a second error correction code word in which a parity generated by said parity encoder is added to said error correction code word, into L (L≧2) number of blocks of data strings at every K (K≧2) bits, generates a second error correction code parity, which is a linear code, in said block units, from the data string of each block, and adds said second error correction code parity of each block to said second error correction code word to create a third error correction code word;

an iterative decoder which iteratively decodes the received encoded data string using the second ECC code parity, decodes said encoded data string into a bit string, and outputs likelihood of each bit; and an ECC decoding circuit which iteratively performs error correction decoding based on the first error correction code of the encoded data string of said iterative decoder, and said encoded bit string correction decoding based on said likelihood according to error detection based on said parity bit.

16. The encoding/decoding device according to claim 15, wherein said second ECC encoder creates a third error correction code word, which satisfies a requirement of a low density parity check (LDPC) code, in which a number of "1s" in a parity check matrix is low (low density) and the code is a linear code, and generates a parity using a generation matrix corresponding to said parity check matrix, and said iterative decoder performs said iterative decoding using said parity of said second error correction code word, from said third error correction code word which satisfies the requirement of the low density parity check (LDPC) code, in which a number of "1s" in said parity check matrix is low (low density) and the code is a linear code, performs hard decision on said encoded data string to be said second error correction code word, and outputs the likelihood of each bit.

17. The encoding/decoding device according to claim 15, wherein said parity encoder divides said error correction code word into L (L≧2) number of blocks, extracts q (q≧2) number of data strings in p (p≧1) bit units from each of said divided blocks, and generates parities for p×q number of data strings, and when said decoding fails, said ECC decoding circuit extracts q (q≧2) number of data strings in p (p≧1) bit units from said L number of blocks including said failed block, regenerates parities for the p×q number of data strings, and compares the parities with said added parity bits to detect errors.

18. A recording/reproducing device, comprising:

a head which writes and reads data to/from a storage medium;

an ECC encoder which interleaves a data string to be written to the storage medium into n (n≧2) blocks of data strings at every m (m≧2) bits, generates a first error correction code parity from the data string of each of said interleaved blocks, and adds said first error correction code parity of each block to said data string to create an error correction code word;

a parity encoder which creates a parity bit at every plurality of bits of said error correction code word, and adds the parity bit to said error correction code word;

a second ECC encoder which divides a second error correction code word in which a parity generated by said parity encoder is added to said error correction code word, into L (L≧2) number of blocks of data strings at every K (K≧2) bits, generates a second error correction code parity, which is a linear code, in said block units, from the data string of each block, and adds said second error correction code parity of each block to said second error correction code word to create a third error correction code word, and outputs the third error correction code word to said head;

an iterative decoder which iteratively decodes said encoded data string read by said head, using the second ECC code parity, decodes said encoded data string into a bit string, and outputs likelihood of each bit; and an ECC decoding circuit which iteratively performs error correction decoding based on the first error correction code of the encoded data string of said iterative decoder, and said encoded bit string correction decoding based on said likelihood according to error detection based on said parity bit.

19. The recording/reproducing device according to claim 18, wherein said second ECC encoder creates a third error correction code word, which satisfies a requirement of a low density parity check (LDPC) code, in which a number of "1s" in a parity check matrix is low (low density) and the code is a linear code, and generates a parity using a generation matrix corresponding to said parity check matrix, and said iterative decoder performs said iterative decoding using said parity of said second error correction code word, from said third error correction code word which satisfies the requirement of the low density parity check (LDPC) code, in which a number of "1s" in said parity check matrix is low (low density) and the code is a linear code, performs hard decision on said encoded data string to be said second error correction code word, and outputs the likelihood of each bit.

20. The recording/reproducing device according to claim 18, wherein said parity encoder divides said error correction code word into L (L≧2) number of blocks, extracts q (q≧2) number of data strings in p (p≧1) bit units from each of said divided blocks, and generates parities for p×q number of data strings, and when said decoding fails, said ECC decoding circuit extracts q (q≧2) number of data strings in p (p≧1) bit units from said L number of blocks including said failed block, regenerates parities for the p×q number of data strings, and compares the parities with said added parity bits to detect errors.

* * * * *